US012269123B1

(12) United States Patent
Budd et al.

(10) Patent No.: US 12,269,123 B1
(45) Date of Patent: Apr. 8, 2025

(54) LASER EDGE SHAPING FOR SEMICONDUCTOR WAFERS

(71) Applicant: Wolfspeed, Inc., Durham, NC (US)

(72) Inventors: Joseph Taylor Budd, Pittsboro, NC (US); Tyler Evan Irion Whitmore, Durham, NC (US); Davis Andrew McClure, Raleigh, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/628,275

(22) Filed: Apr. 5, 2024

(51) Int. Cl.
| | |
|---|---|
| *B23K 26/38* | (2014.01) |
| *B23K 26/03* | (2006.01) |
| *B23K 26/08* | (2014.01) |
| *B23K 26/352* | (2014.01) |
| *H01L 21/04* | (2006.01) |
| *H01L 21/268* | (2006.01) |
| *H01L 21/304* | (2006.01) |
| *B23K 101/40* | (2006.01) |

(52) U.S. Cl.
CPC ............. *B23K 26/38* (2013.01); *B23K 26/03* (2013.01); *B23K 26/08* (2013.01); *B23K 26/3568* (2018.08); *H01L 21/0475* (2013.01); *H01L 21/268* (2013.01); *H01L 21/3043* (2013.01); *B23K 2101/40* (2018.08)

(58) Field of Classification Search
CPC ............... H01L 21/0475; H01L 21/268; H01L 21/3043; H01L 21/461; H01L 21/02021; B23K 26/38; B23K 26/03; B23K 26/08
See application file for complete search history.

(56) References Cited

U.S. PATENT DOCUMENTS

| | | | |
|---|---|---|---|
| 5,643,472 | A | 7/1997 | Engelsberg et al. |
| 6,048,588 | A | 4/2000 | Engelsberg |
| | | (Continued) | |

FOREIGN PATENT DOCUMENTS

| | | | |
|---|---|---|---|
| CN | 115338546 A | | 11/2022 |
| JP | H1167700 A | * | 3/1999 |
| | (Continued) | | |

OTHER PUBLICATIONS

Aminoroaya et al., "A Review of Dental Composites: Challenges, Chemistry Aspects, Filler Influences, and Future Insights", Composites Part B: Engineering, vol. 216, No. 108852, 2021, pp. 1-23.

(Continued)

*Primary Examiner* — Joseph C. Nicely
(74) *Attorney, Agent, or Firm* — Dority & Manning, P.A.

(57) ABSTRACT

Systems and methods for laser-based processing of semiconductor wafers are provided. In one example, a method includes providing emission of a laser from a laser source towards an edge portion of a wide bandgap semiconductor workpiece from a direction facing a side surface of the wide bandgap semiconductor workpiece, the side surface extending between a first major surface of the wide bandgap semiconductor workpiece and an opposing second major surface of the wide bandgap semiconductor workpiece. The method includes ablating the edge portion of the wide bandgap semiconductor workpiece with the laser to remove material from the edge portion of the wide bandgap semiconductor workpiece.

21 Claims, 16 Drawing Sheets

(56) References Cited

U.S. PATENT DOCUMENTS

| | | |
|---|---|---|
| 7,173,285 B2 | 2/2007 | Hallin et al. |
| 7,226,805 B2 | 6/2007 | Hallin et al. |
| 7,396,410 B2 | 7/2008 | Hallin et al. |
| 7,601,986 B2 | 10/2009 | Hallin et al. |
| 9,279,192 B2 | 3/2016 | Hansen et al. |
| 10,002,760 B2 | 6/2018 | Hansen et al. |
| 10,226,835 B2 | 3/2019 | Matsuura |
| 10,319,593 B2 | 6/2019 | Hirata et al. |
| 10,319,594 B2 | 6/2019 | Hirata |
| 10,562,130 B1 | 2/2020 | Donofrio et al. |
| 10,576,585 B1 | 3/2020 | Donofrio et al. |
| 10,611,052 B1 | 4/2020 | Bubel et al. |
| 10,896,815 B2 | 1/2021 | Seddon et al. |
| 10,903,078 B2 | 1/2021 | Schulze et al. |
| 11,034,056 B2 | 6/2021 | Bubel et al. |
| 11,219,966 B1 | 1/2022 | Donofrio et al. |
| 11,289,378 B2 | 3/2022 | Schneider et al. |
| 11,373,859 B2 | 6/2022 | Seddon et al. |
| 11,519,098 B2 | 12/2022 | Khlebnikov et al. |
| 11,654,596 B2 | 5/2023 | Bubel et al. |
| 11,826,846 B2 | 11/2023 | Donofrio et al. |
| 11,901,231 B2 | 2/2024 | Nomoto et al. |
| 11,911,842 B2 | 2/2024 | Donofrio et al. |
| 12,054,850 B2 | 8/2024 | Khlebnikov et al. |
| 12,070,875 B2 | 8/2024 | Bubel et al. |
| 2005/0205871 A1 | 9/2005 | Hallin et al. |
| 2005/0205872 A1 | 9/2005 | Hallin et al. |
| 2006/0032434 A1 | 2/2006 | Mueller et al. |
| 2006/0057850 A1 | 3/2006 | Britt et al. |
| 2006/0243985 A1 | 11/2006 | Hallin et al. |
| 2007/0101930 A1 | 5/2007 | Hallin et al. |
| 2007/0105349 A1 | 5/2007 | Hallin et al. |
| 2010/0311225 A1 | 12/2010 | Sekiya |
| 2014/0024199 A1 | 1/2014 | Qiu et al. |
| 2016/0181375 A1 | 6/2016 | Horii et al. |
| 2017/0025275 A1 | 1/2017 | Hirata et al. |
| 2017/0025276 A1 | 1/2017 | Hirata |
| 2017/0204532 A1 | 7/2017 | Land |
| 2018/0290893 A1 | 10/2018 | Dukes et al. |
| 2019/0326117 A1 | 10/2019 | Seddon et al. |
| 2019/0362960 A1 | 11/2019 | Seddon et al. |
| 2019/0362972 A1 | 11/2019 | Schulze et al. |
| 2020/0361121 A1 | 11/2020 | Bubel et al. |
| 2021/0118666 A1 | 4/2021 | Seddon et al. |
| 2021/0170632 A1 | 6/2021 | Bubel et al. |
| 2021/0198804 A1 | 7/2021 | Khlebnikov et al. |
| 2021/0375620 A1 | 12/2021 | Ahmed et al. |
| 2022/0108882 A1* | 4/2022 | Tsuchiya ............ H01L 21/6836 |
| 2022/0126395 A1 | 4/2022 | Donofrio et al. |
| 2022/0189768 A1 | 6/2022 | Khlebnikov et al. |
| 2022/0254916 A1 | 8/2022 | Miyazato et al. |
| 2022/0403552 A1 | 12/2022 | Leonard et al. |
| 2023/0019230 A1* | 1/2023 | Joo ..................... H01L 24/32 |
| 2023/0133459 A1 | 5/2023 | Tanaka et al. |
| 2023/0241803 A1 | 8/2023 | Bubel et al. |
| 2024/0113235 A1 | 4/2024 | Potera |
| 2024/0189940 A1 | 6/2024 | Donofrio et al. |
| 2024/0266419 A1 | 8/2024 | King et al. |
| 2024/0274660 A1 | 8/2024 | Van Brunt et al. |
| 2024/0352622 A1 | 10/2024 | Khlebnikov et al. |
| 2024/0367348 A1 | 11/2024 | Bubel et al. |
| 2024/0413129 A1 | 12/2024 | Choi et al. |

FOREIGN PATENT DOCUMENTS

| | | |
|---|---|---|
| WO | WO 2005/095679 A2 | 10/2005 |
| WO | WO 2017/053883 A | 3/2017 |

OTHER PUBLICATIONS

Chen et al., "Effect of Laser Incidence Angle on the Femtosecond Laser Ablation Characteristics of Silicon Carbide Ceramics", Optics and Lasers in Engineering, vol. 172, No. 107849, 2024, pp. 1-18.

Cho et al., "Dental Resin Composites: A Review on Materials to Product Realizations", Composites Part B: Engineering, vol. 230, No. 109495, 2022, 65 pages.

Kinashi et al., "UV-Assisted Deposition of TEOS SiO2 Films Using the Spin-Coating Method", Applied Surface Science, vol. 79-80, 1994, pp. 332-337.

Li et al., "Surface Micromorphology and Nanostructures Evolution in Hybrid Laser Processes of Slicing and Polishing Single Crystal 4H-SiC", Journal of Materials Science & Technology, vol. 184, 2024, pp. 235-244.

Moszner et al., "New Developments of Polymeric Dental Composites", Progress in Polymer Science, vol. 26, Issue 4, 2001, pp. 535-576.

Geng et al., "Slicing of 4H-SiC Wafers Combining Ultrafast Laser Irradiation and Bandgap-Selective Photo-Electrochemical Exfoliation", Advanced Materials Interfaces, vol. 10, No. 2300200, 2023, pp. 1-7.

Kim et al., "4H-SiC Wafer Slicing by Using Femtosecond Laser Double-Pulses", Optical Materials Express, vol. 7, No. 7, Jul. 1, 2017, pp. 2450-2460.

Zhang et al., "A Review of Femtosecond Laser Processing of Silicon Carbide", MDPI Micromachines, vol. 15, No. 639, May 10, 2024, pp. 1-26.

Aixtron, "The First Domestic Silicon Carbide Ingot Laser Stripping Equipment was put into Production", Aug. 28, 2024, Morning News, https://www.compoundsemiconductorchina.net/industry-news.asp?id=6308, retrieved on Sep. 10, 2024 with machine translation, 4 pages.

Gie, "HGL Series Wafer Laser Stealth Cutting Equipment", Henan General Intelligent Equipment Co., Ltd., https://www.chngie.com/copy_HGL.html, retrieved on Sep. 10, 2024 with machine translation, 6 pages.

* cited by examiner

LASER EDGE SHAPING FOR SEMICONDUCTOR WAFERS

FIELD

The present disclosure relates generally to semiconductor workpieces and semiconductor device fabrication, and more particularly to laser edge shaping systems and methods for semiconductor workpieces, such as silicon carbide semiconductor wafers.

BACKGROUND

Power semiconductor devices are used to carry large currents and support high voltages. A wide variety of power semiconductor devices are known in the art including, for example, transistors, diodes, thyristors, power modules, discrete power semiconductor packages, and other devices. For instance, example semiconductor devices may be transistor devices such as Metal Oxide Semiconductor Field Effect Transistors ("MOSFET"), bipolar junction transistors ("BJTs"), Insulated Gate Bipolar Transistors ("IGBT"), Gate Turn-Off Transistors ("GTO"), junction field effect transistors ("JFET"), high electron mobility transistors ("HEMT") and other devices. Example semiconductor devices may be diodes, such as Schottky diodes or other devices.

Power semiconductor devices may be packaged into various semiconductor device packages, such as discrete semiconductor device packages and power modules. Power modules may include one or more power devices and other circuit components and can be used, for instance, to dynamically switch large amounts of power through various components, such as motors, inverters, generators, and the like.

Semiconductor devices may be fabricated from wide bandgap semiconductor materials, such as silicon carbide and/or Group III nitride-based semiconductor materials. The fabrication process for power semiconductor devices may require processing of wide bandgap semiconductor wafers, such as silicon carbide semiconductor wafers.

SUMMARY

Aspects and advantages of embodiments of the present disclosure will be set forth in part in the following description, or may be learned from the description, or may be learned through practice of the embodiments.

One example aspect of the present disclosure is directed to a method. The method includes providing emission of a laser from a laser source towards an edge portion of a wide bandgap semiconductor workpiece from a direction facing a side surface of the wide bandgap semiconductor workpiece, the side surface extending between a first major surface of the wide bandgap semiconductor workpiece and an opposing second major surface of the wide bandgap semiconductor workpiece. The method includes ablating the edge portion of the wide bandgap semiconductor workpiece with the laser to remove material from the edge portion of the wide bandgap semiconductor workpiece.

Another example aspect of the present disclosure is directed to a system. The system includes a workpiece support configured to support a semiconductor workpiece, the semiconductor workpiece having a side surface extending between a first major surface and an opposing second major surface. The system includes a laser source configured to: emit a laser towards an edge portion of the semiconductor workpiece from a direction facing the side surface of the semiconductor workpiece, and ablate the edge portion of the semiconductor workpiece with the laser.

Another example aspect of the present disclosure is directed to a method. The method includes obtaining data indicative of a defined edge profile for a peripheral edge portion of the semiconductor workpiece. The method includes determining one or more laser ablation parameters based on the data indicative of the defined edge profile. The method includes ablating, with a laser, the peripheral edge portion of the semiconductor workpiece based at least in part on the one or more laser ablation parameters.

Another aspect of the present disclosure is directed to a semiconductor wafer. The semiconductor wafer includes a silicon carbide structure defined by first and second opposing major surfaces and a peripheral edge. In some examples, the semiconductor wafer includes a laser-defined surface formed along at least a portion of the peripheral edge of the silicon carbide structure.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
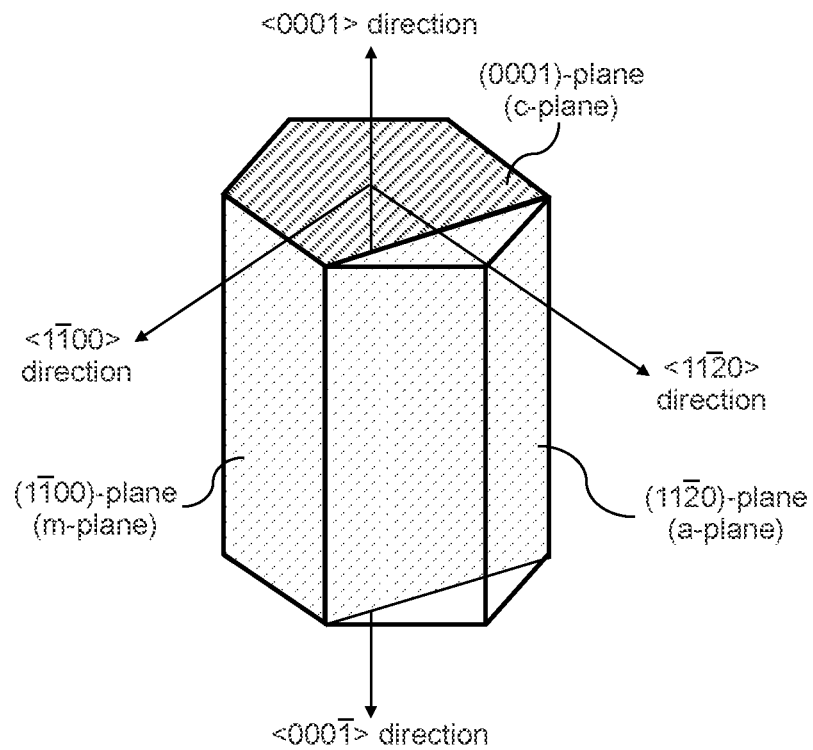
FIG. 1 is a first perspective view of a crystal plane diagram showing the coordinate system for a hexagonal crystal such as 4H-SiC.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Power semiconductor devices are often fabricated from wide bandgap semiconductor materials, such as silicon carbide or Group III-nitride based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures such as wide bandgap semiconductor structures. Those of ordinary skill in the art, using the disclosures provided herein, will understand that the power semiconductor devices according to example embodiments of the present disclosure may be used with any semiconductor material, such as other wide bandgap semiconductor materials, without deviating from the scope of the present disclosure. Example wide bandgap semiconductor materials include silicon carbide and the Group III-nitrides.

Power semiconductor devices may be fabricated using epitaxial layers formed on a semiconductor workpiece, such as a silicon carbide semiconductor wafer. Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces, such as other wide bandgap semiconductor workpieces. Other semiconductor workpieces may include carrier substrates, ingots, boules, polycrystalline substrates, monocrystalline substrates, bulk materials having a thickness of greater than 1 millimeter, such as greater than about 5 millimeters, such as greater than about 10 millimeters, such as greater than about 20 millimeters, such as greater than about 50 millimeters, such as greater than about 100 millimeters, to 200 millimeters, etc.

In some examples, the semiconductor workpiece includes silicon carbide crystalline material. The silicon carbide crystalline material may have a 4H crystal structure, 6H crystal structure, or other crystal structure. The semiconductor workpiece can be an on-axis workpiece (e.g., end face parallel to the (0001) plane) or an off-axis workpiece (e.g., end face non-parallel to the (0001) plane).

Aspects of the present disclosure may make reference to a surface of the semiconductor workpiece. In some examples, the surface of the workpiece may be, for instance, a silicon face of the workpiece. In some examples, the surface of the workpiece may be, for instance, a carbon face of the workpiece.

In some examples, a semiconductor wafer may be a solid semiconductor workpiece upon which semiconductor device fabrication may be implemented. A semiconductor wafer may be a homogenous material, such as silicon carbide, and may provide mechanical support for the formation and/or carrying of additional semiconductor layers (e.g., epitaxial layers), metallization layers, and other layers to form one or more semiconductor devices. In semiconductor wafer may have a thickness in a range of about 0.5 microns to about 1000 microns. For instance, the semiconductor wafer may have thickness of less than about 500 microns, such as less than about 300 microns, such as less than about 200 microns, such as in a range of about 100 microns to about 500 microns, such as in a range of about 120 microns to 180 microns.

A semiconductor wafer may be characterized by a plurality of surfaces. For example, a semiconductor wafer may have a "first major surface" and a "second major surface." The first major surface may be generally opposite the second major surface. The first and second major surfaces may be generally parallel to one another. A semiconductor wafer may also have a "a side surface" corresponding to a surface extending between the two major surfaces. For example, the side surface may extend between the first major surface and the second major surface. Some semiconductor wafer processing operations (e.g., slicing or otherwise separating a larger portion of semiconductor material into discrete wafers) result in a perpendicular edge on the periphery of the wafer along the side surface of the semiconductor wafer. Perpendicular edges of semiconductor wafers may be sharp and readily fractured, producing undesirable edge chips and particles during wafer handling.

Power semiconductor device fabrication processes may include surface processing operations that are performed on the silicon carbide semiconductor wafer to prepare one or more surfaces of the silicon carbide semiconductor wafer for later processing steps, such as surface implantation, formation of epitaxial layers, metallization, etc.). Example surface processing operations may include grinding operations, lapping operations, and polishing operations. Methods for surface processing of semiconductor wafers in semiconductor manufacturing may include grinding, lapping, and/or polishing the rough surfaces until a sufficient smoothness and/or thickness is achieved.

Grinding is a material removal process that is used to remove material from the semiconductor wafer. Grinding may be used to reduce a thickness of a semiconductor wafer. Grinding typically involves exposing the semiconductor wafer to an abrasive containing surface, such as grind teeth on a grind wheel. Grinding may remove material of the semiconductor wafer through engagement with the abrasive surface.

Lapping is a precision finishing process that uses a loose abrasive in slurry form. The slurry typically includes coarser particles (e.g., largest dimension of the particles being greater than about 100 microns) to remove material from the semiconductor wafer. Lapping typically does not include engaging the semiconductor wafer with an abrasive-containing surface on the lapping tool (e.g., a wheel or disc having an abrasive-containing surface). Instead, the semiconductor wafer typically comes into contact with a lapping plate or a tile usually made of metal. Lapping typically provides better planarization of the semiconductor wafer relative to grinding.

Polishing is a process to remove imperfections and create a very smooth surface with a low surface roughness. Polishing may be performed using a slurry and a polishing pad. The slurry typically includes finer particles relative to lapping, but coarser particles relative to chemical mechanical planarization (CMP). Polishing typically provides better planarization of the semiconductor wafer relative to grinding.

CMP is a type of fine or ultrafine polishing, typically used to produce a smoother surface ready, for instance, for epitaxial growth of layers on the semiconductor wafer. CMP may be performed chemically and/or mechanically to remove imperfections and to create a very smooth and flat surface with low surface roughness. CMP typically involves changing the material of the semiconductor through a chemical process (e.g., oxidation) and removing the new material from the semiconductor wafer through abrasive contact with a slurry and/or other abrasive surface or polishing pad (e.g., oxide removal). In CMP, the abrasive elements in the slurry typically remove the product of the chemical process and do not remove the bulk material of the semiconductor wafer, often leaving very low subsurface damage.

In some instances, several grinding processes and/or other surface processing operations may be performed to achieve sufficient smoothness. For instance, a coarse grinding process may reduce substantial irregularities or impurities and reduce wafer thickness and a fine grinding process may finalize the surface and achieve the sufficient smoothness for further fabrication processes (e.g., lapping and/or polishing).

Current methods for smoothing semiconductor wafer edges may involve grinding. Grinding methods may incur substantial time, material, and consumable tool loss and cost due to the structural properties of the crystalline materials used in semiconductor devices and smoothness requirements of semiconductor devices. Materials used in wide bandgap semiconductor devices, such as, for example, silicon carbide, have extreme rigidity and strength requiring expensive tools (e.g., with diamond abrasive elements) that are rapidly consumed. The grinding process also results in material losses from grinding away potential usable material to provide a sufficiently smooth surface for semiconductor device manufacturing. Diamond or other abrasive wheels may experience continuous wear during repeated grinding operations, thus requiring costly replacement for high volume processing of semiconductor wafers. Edge grinding may also create a liquid waste stream with swarf corresponding to fragments of semiconductor material and/or diamond wheels mixed with water or other liquid used to cool the grinding wheels.

Manual setup of conventional grinding systems for edge shaping may require numerous iterations, resulting in time inefficiencies and a large number of test wafers required to ensure proper alignment for desired grinding results. A lack of viable feedback features during edge grinding may limit opportunities for ensuring desired wafer parameters (e.g., target diameter, edge profile, etc.).

Accordingly, aspects of the present disclosure are directed to using a laser-based system for edge shaping of the exposed side surfaces of semiconductor wafers, such as, but not limited to wide bandgap semiconductor wafers including a silicon carbide and/or a Group III-nitride, or any exposed surfaces of semiconductor materials. For instance, aspects of the present disclosure are directed to a method of providing emission of a laser from a laser source towards an edge portion of a semiconductor wafer from a direction facing a side surface of the semiconductor wafer. As used herein, providing emission of a laser refers to both providing continuous emission and/or providing modulated emission (e.g., a plurality of laser pulses).

In some examples, a direction facing the side surface of the semiconductor may correspond to any direction that intersects the side surface prior to any other surface on the semiconductor wafer. Other surfaces may include first and second major surfaces of the semiconductor wafer, between which the side surface may extend. A relative arrangement of the laser and associated surfaces of the semiconductor wafer may be appreciated by positioning the laser source to output the laser in a first plane that is generally parallel to respective planes defined by the first major surface and the opposing second major surface of the semiconductor wafer. For instance, one or more mirrors of the laser source may be controlled to direct the laser to the edge portion of the semiconductor wafer. Providing emission of a laser in this particular manner may advantageously provide edge shaping along the entire side surface without flipping the semiconductor wafer.

In some examples, the edge portion of the semiconductor wafer may be ablated with the laser to remove material from the edge portion of the semiconductor wafer. For instance, the edge portion of the semiconductor wafer may be ablated to have a defined edge profile (e.g., a beveled edge, a rounded edge, or other non-perpendicular edge).

Additionally or alternatively, the edge portion of the semiconductor wafer may be ablated to reduce a surface roughness of the edge portion of the semiconductor wafer. For example, ablation of the edge portion of the semiconductor wafer may form a shaped edge portion having a surface with a surface roughness in a range about 0.5 nanometers to about 65 microns, such as about 0.1 micron to about 1 micron. In some instances, the surface roughness may be in a range of about 0.5 nanometers to about 125 nanometers, such as about 1 nanometer and about 100 nanometers, such as about 2 nanometers and about 50 nanometers.

Aspects of the present disclosure refer to and/or claim a "surface roughness" of a surface. As used herein, unless otherwise specifically noted, the surface roughness is measured as "areal average roughness" Sa. When the present disclosure or claims refer to a surface having a surface roughness being within a range of values, a surface has a surface roughness in the range of values if any 100 microns× 100 micron area on the surface includes a surface roughness Sa within the specified range of values or if any 100 micron×100 micron area on the surface includes a surface roughness Sz (maximum height) within the specified range of values.

As an example, a surface has a surface roughness in a range of 0.5 nanometers to 180 nanometers if any 100 micron×100 micron area on the surface has a surface roughness Sa in the range of 0.5 nanometers to 180 nanometers or if any 100 micron×100 micron area on the surface has a surface roughness Sz in the range of 0.5 nanometers to 180 nanometers. For the sake of clarity, it is not required that the entire surface have the surface roughness in the specified range of values. Only a single 100 micron×100 micron area on the surface is required to have a surface roughness in the specified range of values (e.g., either Sa or Sz) for the surface to be considered to have a surface roughness in the specified range of values.

Additionally or alternatively, the edge portion of the semiconductor wafer may be ablated to form a defined diameter of the semiconductor wafer. For example, the defined diameter may be in a range of about 100 millimeters to about 300 millimeters, such as in a range of about 100 millimeters to about 200 millimeters, such as about 100 millimeters, such as about 150 millimeters, or such as about 200 millimeters.

In some examples, the edge portion of the semiconductor wafer may be ablated to form a shaped wafer edge. The shaped wafer edge may have one or more strain features for relieving stress forces that could be imposed upon the wafer in certain manufacturing or operation conditions. The shaped wafer edge may have one or more cooling features for providing thermal dissipation when excess heat is encountered during certain manufacturing or operating conditions.

In some examples, the semiconductor wafer has a notch. For instance, the notch may be provided as a relatively small indentation along a peripheral edge of the semiconductor wafer. The notch may be formed in a particular shape (e.g., a V-shape or a C-shape). The notch may serve a functional purpose for orientation, alignment, and/or a grip location for safe handling of the semiconductor wafer. The edge portion of the semiconductor wafer may be ablated within the notch. In some embodiments, the notch may also be formed using the laser emitted from the laser source. When forming the notch, the laser may be emitted in the same direction or in a different direction (e.g., rotated by about 90 degrees) relative to the laser direction used for edge shaping.

In some examples, the semiconductor wafer has a flat. For instance, the flat may be provided as a substantially straight edge on a peripheral edge of a round semiconductor wafer. The flat may serve a functional purpose for alignment, orientation, and/or a reference for the orientation of semiconductor crystalline material used to fabricate the wafer. The edge portion of the semiconductor wafer may be ablated within the flat. In some embodiments, the flat may also be formed using the laser emitted from the laser source. When forming the flat, the laser may be emitted in the same direction or in a different direction (e.g., rotated by about 90 degrees) relative to the laser direction used for edge shaping.

To perform the laser ablation process, relative motion may be imparted between the semiconductor wafer and the laser(s) ablating the edge portions thereof. It should be appreciated that both moving the laser relative to a side surface of the semiconductor wafer and moving the side surface relative to the laser(s) may fall within the scope of the present disclosure. During a laser-based edge shaping operation according to examples of the present disclosure, the laser may, for example, scan an azimuthal section (e.g., a section of about 60 degrees or less, about 20 degrees or less, a section of between about 10 degrees to about 30 degrees, etc.) by controlling mirrors or other optics associated with the laser source. Motion may then be applied to a workplace carrier or other fixture on which the semiconductor wafer is mounted to orient the laser towards another azimuthal section. In some examples, the edge portion of the semiconductor wafer may be ablated within each of a plurality of azimuthal sections of the semiconductor wafer in a predetermined (e.g., sequential) manner. For instance, each azimuthal section can be ablated in a plurality of vertical, horizontal, and/or angled scans across the azimuthal section. In some embodiments, each azimuthal section may be about 20 degrees or less, although azimuthal sections of up to about 60 degrees may be employed in other embodiments.

In some examples, the laser ablation process may be performed on the exposed surface at a fixed focal depth at or near the edge surface. The focal depth may be a depth within about 0 microns (e.g., on the edge surface) to about 1000 microns past the edge surface, such as about 0 microns to about 100 microns past the edge surface, such as about 0 microns to about 10 microns past the edge surface, such as about 0 microns to about 5 microns past the edge surface. In some examples, the laser ablation process may be performed in multiple passes of the laser over the same position of the workpiece at the fixed focal depth to achieve desired material removal or thickness reduction in the exposed surface. For instance, multiple passes of the laser at a fixed focal depth at about 1 microns past the most peripheral portion of the edge surface may be performed to achieve a desired reduction in thickness of about 25 microns or more.

More particularly, the edge portion of the semiconductor wafer may be ablated by providing emission of the laser in a plurality of scans across the edge portion. Each pass of the laser may have a scan dimension (e.g., spot size) representative of a dimension of the laser on the edge surface. The scan dimension (e.g., spot size) may be in a range of, for instance, 10 microns to about 25 millimeters, such as about 500 microns to about 25 millimeters, such as about 1 millimeter to about 25 millimeters, such as about 1 millimeter to about 10 millimeters. In some examples, there may be a distance between passes of each laser. The distance between each scan or pass may be, for instance, in a range of about 0 millimeters to about 1 millimeter, such as about 0 microns to about 500 microns. In some examples, there may be no distance between passes of each laser. In some examples, there may be overlap between scans or passes of the laser on the surface. In some examples, there may be about 0% to about 50% overlap of the scan dimension between passes of each laser. Additionally or alternatively, each scan of the plurality of scans may remove material to a depth of about 1 micron to about 10 microns.

In some examples, the edge portion of the semiconductor wafer may be ablated to form a laser-defined surface. The laser-defined surface may include a plurality of laser-defined features (e.g., strips of removed material) arranged in a repeating pattern on the laser-defined surface. The plurality of laser-defined features may extend vertically between first and second opposing major surfaces of the semiconductor wafer. The plurality of laser-defined features may additionally or alternatively extend horizontally or in any other particular direction relative to the first and second opposing major surfaces.

In some examples, the edge portion of the semiconductor wafer may be ablated by obtaining data indicative of the defined edge profile. One or more laser ablation parameters may be determined based on the data indicative of the defined edge profile. The edge portion of the semiconductor wafer may then be ablated with the laser based at least in part on the one or more laser ablation parameters.

In some embodiments, the laser ablation parameters may be defined as a function of position on the side surface of the semiconductor wafer (e.g., the parameters are modified and changed based on position of the one or more lasers on the side surface). The laser parameters may be adjusted and/or selected as a function of position on the side surface. For instance, the laser parameters at a first position with a high surface roughness may be different from the laser parameters at a second position with less surface roughness.

Additionally, or alternatively, laser may operate in accordance with one or more of the following laser ablation parameters:

Laser wavelength: about 190 nanometers to about 1100 nanometers, such as about 190 nanometers to about 300 nanometers, such as about 193 nanometers, such as about 200 nanometers, such as about 248 nanometers, such as about 266 nanometers, such as about 343 nanometers, such as about 355 nanometers, such as about 405 nanometers, such as about 532 nanometers, such as about 1064 nanometers, such as about 1080 nanometers;

Laser pulse frequency: Pulse frequency: about 1 KHz to about 200 KHz, such as about 10 KHz to about 150 KHz, such as about 20 KHz to about 100 KHz;

Laser power: 0.1 W to about 500 W, such as about 0.5 W to about 100 W, such as about 1 W to about 40 W, such as about 1 W to about 10 W;

Laser pulse duration: about 0.1 femtoseconds to about 300 nanoseconds; such as about 1 femtosecond to about 500 picoseconds, such as about 1 femtosecond to about 150 nanoseconds, such as about 1 femtosecond to about 100 nanoseconds;

Translation speed: about 1 millimeter per second to about 10 meters per second, such as about 1 meter per second to about 10 meters per second Focusing depth: about 0 to about 2000 microns (beneath the surface of the workpiece), such as about 0 to about 1000 microns (beneath the surface of the workpiece), such as about 1 micron to about 100 microns (beneath the surface of the workpiece), such as about 0 to about 5 microns (beneath the surface of the workpiece), such as about 0 microns to about 1 micron (beneath the surface of the workpiece);

Laser Pulse Energy: about 1 nanojoule to about 1 Joule, such as about 10 nanojoules to about 200 millijoules.

In some examples, sensor data may be obtained from a sensor positioned relative to the laser source and the semiconductor wafer. In some embodiments, the sensor data may be indicative of a current state of the edge portion as observed in real-time or near real-time during the laser ablation process. One or more of the laser ablation parameters may be adjusted, changed, or tuned depending on the sensor data, thus providing active feedback monitoring and precision control for laser edge shaping operations.

In some examples, to adjust the one or more laser ablation parameters, data may be obtained regarding the edge portion of the side surface before, during, and/or after the ablation process. For instance, the data may include, for instance, workpiece property data that provides data associated with a surface of the workpiece (e.g., topography, roughness), subsurface regions of the workpiece, optical properties of the workpiece, temperature of the workpiece, doping level of the workpiece, polytype of the workpiece (e.g., 4H, 6H), or other parameters. For instance, the workpiece property data may be obtained using one or more sensors. In some examples, the workpiece property data may include data associated with a surface topography of the workpiece. In some examples, the workpiece property data may include an image of the exposed surface may be obtained using an optical sensor or image capture device. In some examples, a scan of the exposed surface may be obtained using one or more surface measurement lasers or other optical devices. In some examples, an image may be captured of the exposed surface and analyzed using computer image processing techniques (e.g., classifier models, such as machine-learned classifier models) to determine data indicative of workpiece properties, such as the presence of anomalies, defects, roughness, topography, optical properties, etc.

Aspects of the present disclosure are directed to systems for implementing the methods discussed herein. For instance, aspects of the present disclosure relate to a system for forming a semiconductor wafer (e.g., by shaping edges of a semiconductor wafer). The system includes a workpiece support configured to support a semiconductor wafer. The semiconductor wafer has a side surface extending between a first major surface and an opposing second major surface. The system further includes a laser source configured to emit a laser towards an edge portion of the semiconductor wafer from a direction facing the side surface of the semiconductor wafer. The laser source is further configured to ablate the edge portion of the semiconductor wafer with the laser.

In some examples, the system may include a controller. The controller may be configured to perform various operations relative to the workpiece support and/or the semiconductor wafer. For instance, the controller may obtain data indicative of a defined edge profile for the semiconductor wafer. The controller may determine one or more laser ablation parameters based on the data indicative of the defined edge profile and control the laser to ablate the edge portion of the semiconductor wafer based at least in part on the one or more laser ablation parameters. Laser ablation parameters may include, for example, one or more particular positions on the side surface of the semiconductor wafer and/or one or more operating characteristics of the laser (e.g., focusing depth, laser power, laser wavelength, laser pulse duration, laser pulse frequency, laser pulse energy, and/or translation speed).

In some examples, the system may include a sensor operable to obtain sensor data indicative of a current state of the edge portion. The controller may be further configured to adjust the laser ablation parameters based at least in part on the sensor data obtained from the sensor. For instance, the sensor may be an optical sensor, image capture device, or one or more surface measurement lasers. In some examples, the sensor(s) may be used to determine a surface topography of the ablated side surface.

In some examples, the system may include two or more laser sources operable to emit two or more different lasers. Each laser may be configured to operate in accordance with the same laser parameters or different laser parameters (e.g., different wavelengths). In another example embodiment, multiple lasers (e.g., two lasers, three lasers, four lasers, etc.) can be provided at different positions around the periphery of a semiconductor wafer in order to ablate different edge portions simultaneously or at coordinated intervals. In some examples, multiple lasers can be advantageous to reduce a total ablation time for edge shaping compared to a single laser.

Aspects of the present disclosure are further directed to a semiconductor wafer. The semiconductor wafer may include a silicon carbide structure (e.g., 4H silicon carbide, 6H silicon carbide). The semiconductor wafer is defined by first and second opposing major surfaces and a peripheral edge. The semiconductor wafer may include a laser-defined surface formed along at least a portion of the peripheral edge of the silicon carbide structure. In some examples, the semiconductor workpiece may have a diameter in a range of about 100 millimeters to about 300 millimeters, such as about 100 millimeters, such as about 150 millimeters, such as about 200 millimeters.

In some examples, the laser-defined surface may include a plurality of laser-defined features (e.g., strips of removed material) arranged in a repeating pattern on the laser-defined surface. For instance, the plurality of laser-defined features may be arranged in the repeating pattern on the laser-defined surface and extend vertically between the first and second opposing major surfaces of the silicon carbide structure. The plurality of laser-defined features may additionally or alternatively extend horizontally or in any other particular direction relative to the first and second opposing major surfaces. The repeating pattern may correspond to the scanning path of the laser during an edge shaping operation. Each laser-defined feature (e.g., strip) may have a width w1 corresponding generally to a scan dimension associated with the laser during the laser scan. For instance, the width w1 may be in a range of about 10 microns to about 25 millimeters, such as about 10 microns to about 1 millimeters, such as about 10 microns to about 100 microns. The laser-defined surface may include a surface roughness in a range of about 0.5 nanometers to about 65 microns, such as about 0.1 micron to about 1 micron. In some instances, the surface roughness may be in a range of about 0.5 nanometers to about 125 nanometers, such as about 1 nanometer and about 100 nanometers, such as about 2 nanometers and about 50 nanometers.

Aspects of the present disclosure provide a number of technical effects and benefits. For instance, aspects of the present disclosure allow for edge shaping of semiconductor material surfaces without the use of consumable tools through non-surface contacting technologies. More specifically, aspects of the present disclosure allow for edge shaping of semiconductor material surfaces using one or more lasers that are not consumed and therefore considerably reduce the manufacturing cost and time of semiconductor devices with high material strength and rigidity, such as silicon carbide. Additionally, operation costs of non-consumable surface edge shaping methods do not grow in tandem with operational growth. Rather, operation costs may remain linear or stagnant due to lack of deterioration from non-surface contact.

As another example, the use of non-surface contacting technologies for shaping semiconductor material edges reduces the material lost due to manufacturing defects brought on during traditional edge shaping practices. For instance, edge shaping operations that use grinding may damage otherwise healthy portions of semiconductor wafers and create a loss of the semiconductor wafer entirely, or may result in additional material lost to the edge shaping operation to correct the damage. Laser ablation can also provide a cleaner edge shaping solution that reduces or eliminates material waste streams often present in conventional edge grinding.

As yet another example, the use of laser edge shaping for semiconductor wafers may provide improved setup and active feedback for edge shaping operations. The sensor and controller features of a laser source may help ensure proper alignment to a wafer side surface, thus reducing or eliminating the typical large number of test wafers needed for manual setup. The sensor and controller features of a laser source may additionally or alternatively help ensure that desired wafer parameters are achieved at stages of the laser ablation process. Example wafer parameters may include a target wafer diameter, edge profile, surface roughness, or the like.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, n type material has a majority equilibrium concentration of negatively charged electrons, while p type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

FIG. 1 is a first perspective view crystal plane diagram showing the coordinate system for a hexagonal crystal such as 4H-silicon carbide ("SiC"), in which the c-plane (0001) is perpendicular to both the m-plane (1$\bar{1}$00) and the a-plane (11$\bar{2}$0). The c-plane is perpendicular to the <0001> direction. The m-plane (1$\bar{1}$00) is perpendicular to the <1$\bar{1}$00> direction. The a-plane (11$\bar{2}$0) is perpendicular to the <11$\bar{2}$0> direction. The <000$\bar{1}$> direction is opposite the <0001> direction.

Figure 2:
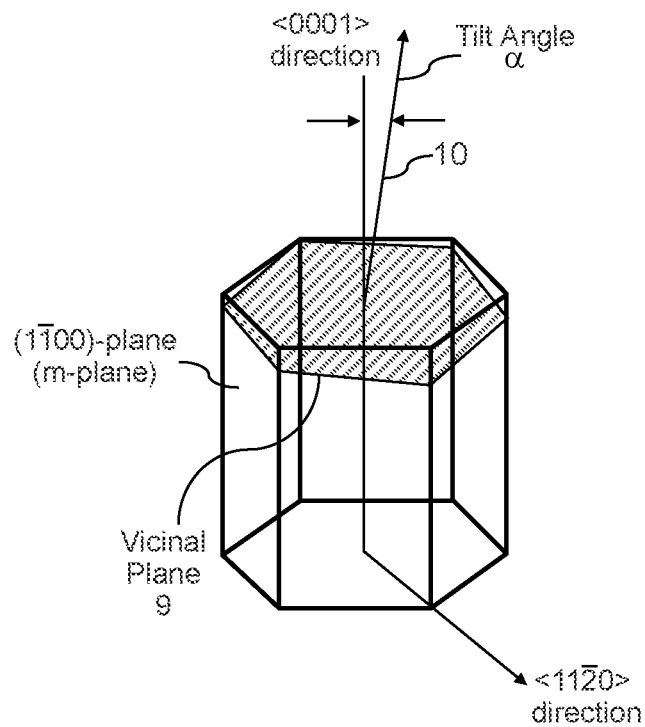
FIG. 2 is a second perspective view of a crystal plane diagram for a hexagonal crystal, illustrating a vicinal plane that is non-parallel to the c-plane.

FIG. 2 is a second perspective view crystal plane diagram for a hexagonal crystal, illustrating a vicinal plane 9 that is non-parallel to the c-plane, wherein a vector 10 (which is normal to the vicinal plane 9) is tilted away from the <0001> direction by a tilt angle α, with the tilt angle α being inclined (slightly) toward the <11$\bar{2}$0> direction.

Figure 3A:
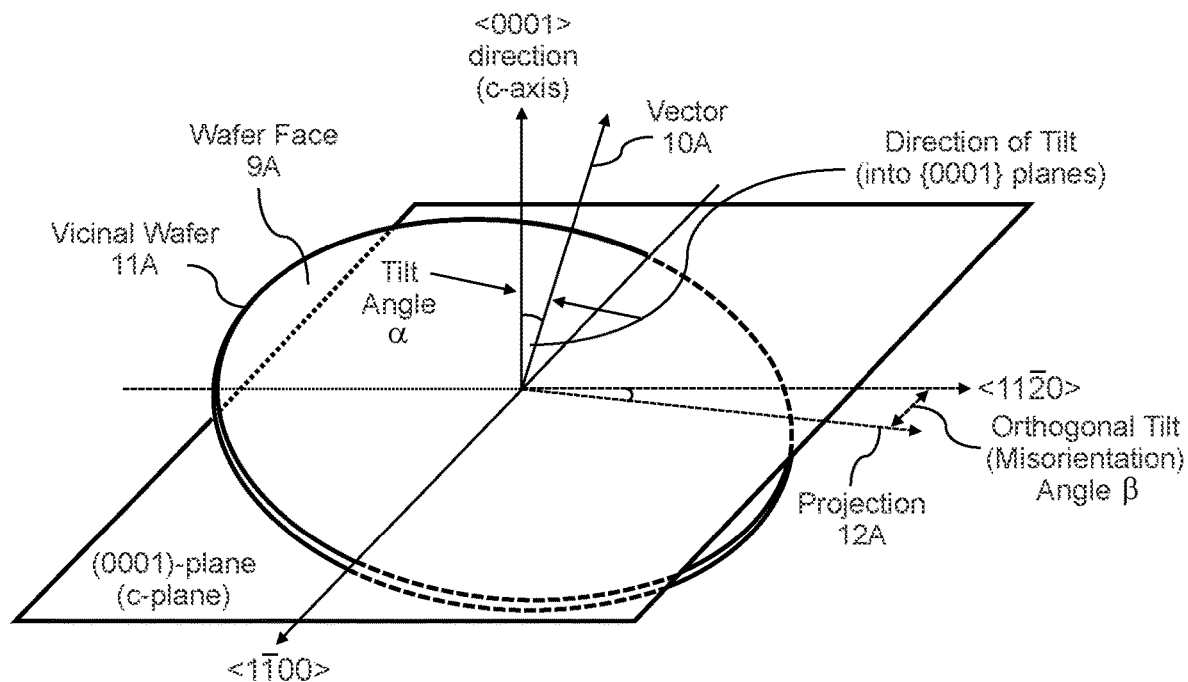
FIG. 3A is a perspective view of a wafer orientation diagram showing orientation of a vicinal wafer relative to the c-plane.

FIG. 3A is a perspective view of a wafer orientation diagram showing orientation of a vicinal wafer 11A relative to the c-plane (0001), in which a vector 10A (which is normal to the wafer face 9A) is tilted away from the <0001> direction by a tilt angle α. An orthogonal tilt (or misorientation angle) B may span between the <1120> direction and the projection of vector 10A onto the c-plane.

Figure 3B:
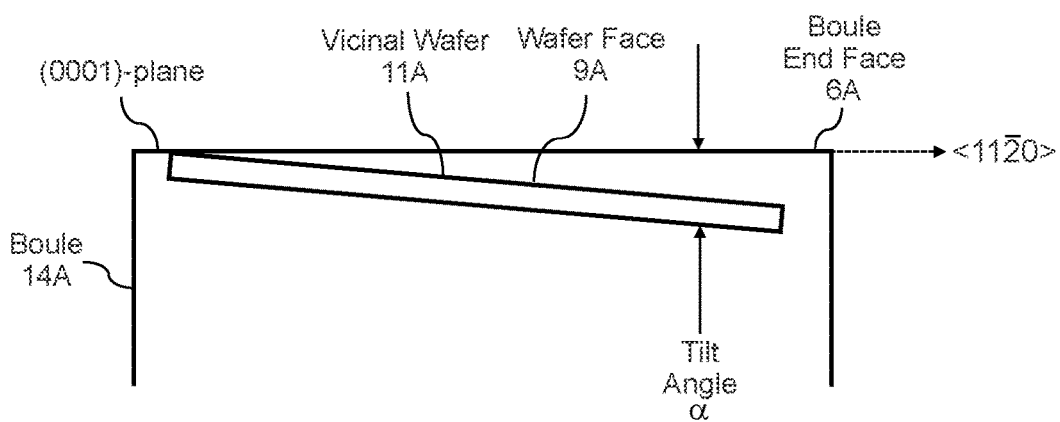
FIG. 3B is a simplified cross-sectional view of the vicinal wafer of FIG. 4A superimposed over a portion of a boule.

FIG. 3B is a simplified cross-sectional view of the vicinal wafer 11A superimposed over a portion of a boule 14A (e.g., an on-axis boule having an end face 6A parallel to the (0001) plane) from which the vicinal wafer 11A was defined. FIG. 3B shows that the wafer face 9A of the vicinal wafer 11A is misaligned relative to the (0001) plane by a tilt angle α.

Figure 3C:
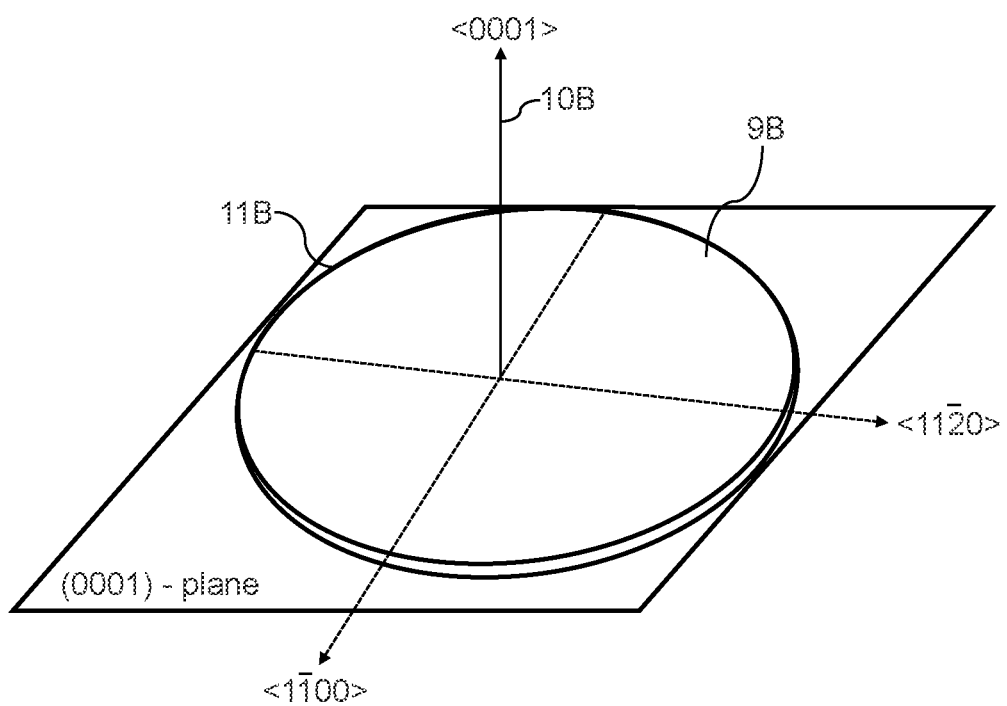
FIG. 3C is a perspective view of a wafer orientation diagram showing orientation of an on-axis wafer relative to the c-plane.
Figure 3D:
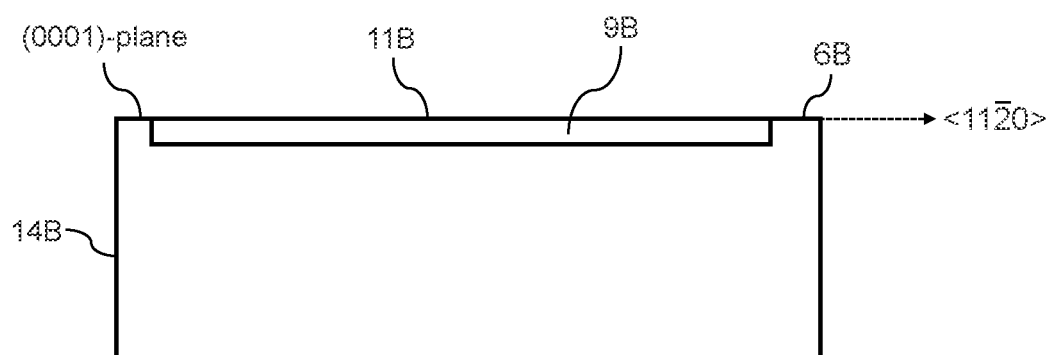
FIG. 3D is simplified cross-sectional view of the wafer of FIG. 3C superimposed over a portion of a boule.

FIG. 3C is a perspective view of wafer orientation diagram showing orientation of an on-axis wafer 11B relative to the c-plane (0001), in which a vector 10B (which is normal to the wafer face 9B) is parallel to the <0001> direction. FIG. 3D is a simplified cross-sectional view of the wafer 11B superimposed over a portion of a boule 14B (e.g., an on-axis boule having an end face 6B parallel to the (0001) plane). FIG. 3D shows that the wafer face 9B of the on axis-wafer 11B is aligned with the (0001) plane.

Methods disclosed herein may be applied to substrates of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Example materials include, but are not limited to, silicon, gallium arsenide, and diamond.

In certain embodiments, such methods may utilize single crystal semiconductor materials having a hexagonal crystal structure, such as 4H-SiC, 6H-SiC, or Group III-nitride materials (e.g., GaN, AlN, InN, InGaN, AlGaN, or AlInGaN). Various illustrative embodiments described hereinafter mention SiC generally or 4H-SiC specifically, but it is to be appreciated that any suitable crystalline material may be used. Among the various SiC polytypes, the 4H-SiC polytype is particularly attractive for power electronic devices due to its high thermal conductivity, wide bandgap, and isotropic electron mobility. Bulk silicon carbide may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof such as 2 to 6 degrees or another subrange), as may be suitable for forming n-doped or highly conductive material).

Certain embodiments herein may use substrates of doped or undoped silicon carbide, such as silicon carbide boules, which may be grown by physical vapor transport (PVT) or other conventional boule fabrication methods. If doped SiC is used, such doping may render the SiC n-type or semi-insulating in character. In certain embodiments, an n-type silicon carbide boule is intentionally doped with nitrogen. In certain embodiments, an n-type silicon carbide boule includes resistivity values within a range of 0.015 to 0.028 Ohm-centimeters. In certain embodiments, a silicon carbide boule may have resistivity values that vary with vertical position, such that different substrate portions (e.g., wafers) have different resistivity values, which may be due to variation in bulk doping levels during boule growth. In certain embodiments, a silicon carbide boule may have doping levels that vary horizontally, from a higher doping region proximate to a center of the boule to a lower doping level proximate to a lateral edge thereof.

Figure 3E:
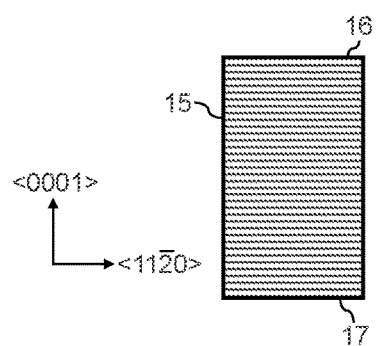
FIG. 3E is a side elevation schematic view of an on-axis boule of crystalline material.
Figure 3F:
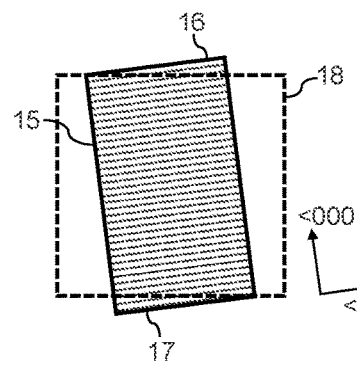
FIG. 3F is a side elevation schematic view of the boule of FIG. 5A being rotated by 4 degrees, with a superimposed pattern for cutting end portions of the boule.
Figure 3G:
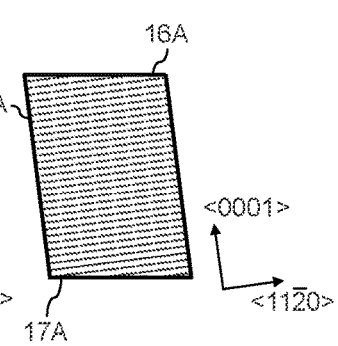
FIG. 3G is a side elevation schematic view of a boule following removal of end portions to provide end faces that are non-perpendicular to the c-direction.

FIGS. 3E and 3G schematically illustrate on-axis and off-axis crystalline substrates in the form of boules that may be utilized with methods disclosed herein. FIG. 3E is a side elevation schematic view of an on-axis boule 15 of crystalline material having first and second end faces 16, 17 that are perpendicular to the c-direction (i.e., <0001> direction for a hexagonal crystal structure material such as 4H-SiC). FIG. 3F is a side elevation schematic view of the boule 15 of FIG. 3E being rotated by four degrees, with a superimposed pattern 18 (shown in dashed lines) for cutting and removing end portions of the boule 15 proximate to the end faces 16, 17. FIG. 3G is a side elevation schematic view of an off-axis boule 15A formed from the boule 15 of FIG. 3F, following removal of end portions to provide new end faces 16A, 17A that are non-perpendicular to the c-direction. Aspects of the present disclosure are applicable to both on-axis boules 15 and/or off-axis boules 15A or other on-axis crystalline materials and/or off-axis crystalline materials.

Figure 3H:
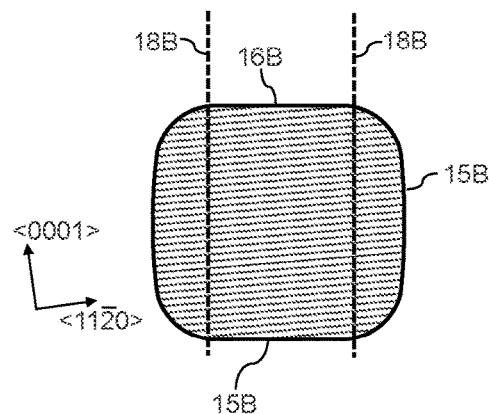
FIG. 3H is a side elevation schematic view of an off-axis grown boule of crystalline material.
Figure 3I:
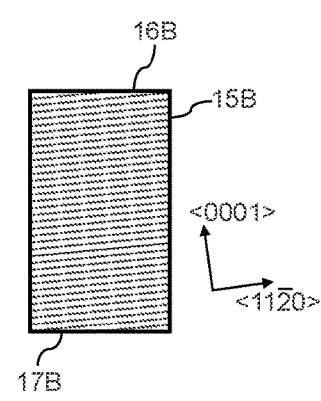
FIG. 3I is a side elevation schematic view of an off-axis grown boule having end faces that are non-perpendicular to the c-direction.

FIGS. 3H and 3I schematically illustrate off-axis grown boules that may be utilized with methods disclosed herein. FIG. 3H is a side elevation schematic view of an off-axis grown boule 15B of crystalline material (e.g., grown from an off-axis seed material) having first and second end faces 16B and 17B that are non-perpendicular to the c-direction (e.g., <0001> direction for a hexagonal crystal structure material such as 4H-SiC). Portions of the boule 15B may be cut along the superimposed pattern 18B (shown in dashed lines) to provide the off-axis boule 15B shown in FIG. 3I. Off-axis semiconductor wafers may be provided from the off-axis boule 15E by cutting or otherwise removing the wafers from the boule 15B in a manner parallel to the faces 16B, 17B.

Figure 4A:
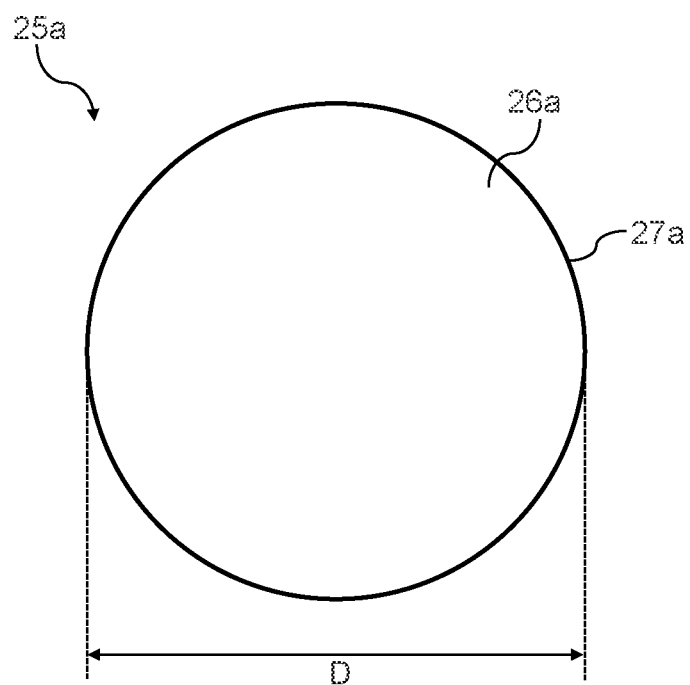
FIG. 4A is a top plan view of an example SiC wafer.

FIG. 4A is a top plan view of an example SiC wafer 25a including a first major surface (e.g., an upper face) 26a. The first major surface 26a is opposite a second major surface (e.g., a lower face) not visible in FIG. 4A. A side surface 27a (e.g., edge surface) extends between the first major surface 26a and second major surface such that wafer 25a is laterally bounded by a generally circular peripheral edge, having a diameter D. The edge shaping operations described herein can be applied to one or more edge portions of wafer 25a to form a shaped edge portion around some or all of the side surface 27a.

Figure 4B:
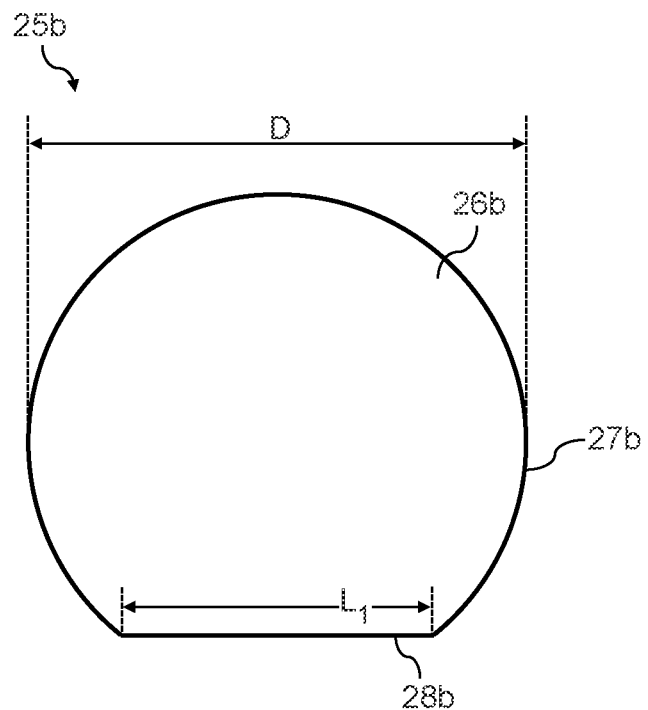
FIG. 4B is a top plan view of an example SiC wafer including a primary flat.

FIG. 4B is a top plan view of an example SiC wafer 25b including a first major surface (e.g., an upper face) 26b. The first major surface 26b is opposite a second major surface (e.g., a lower face) not visible in FIG. 4B. A side surface 27b extends between the first major surface 26b and second major surface such that wafer 25b is laterally bounded by a generally circular peripheral edge having a diameter D. Side surface 27b may include a primary flat 28b (having a length L1). The edge shaping operations described herein can be applied to one or more edge portions of wafer 25b to form a shaped edge portion around some or all of the side surface 27b, including some or all of primary flat 28b. In some embodiments, flat 28b can be formed by applying laser ablation to a substantially round wafer (e.g., SiC wafer 25a of FIG. 4A).

Figure 4C:
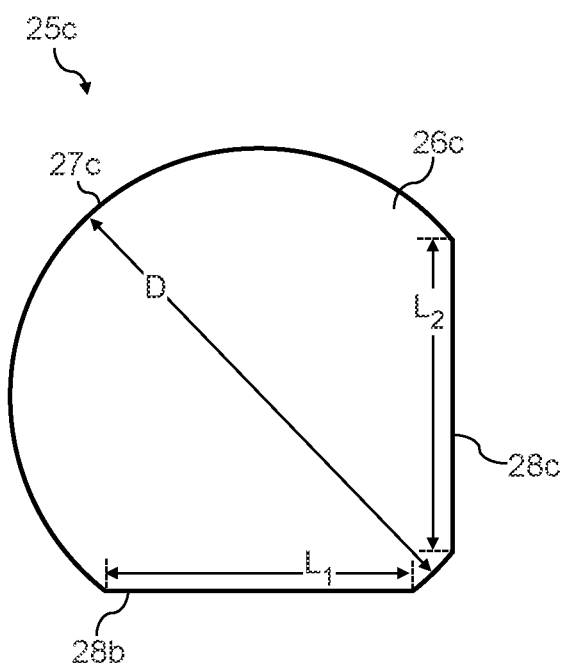
FIG. 4C is a top pan view of an example SiC wafer including primary and secondary flats.

FIG. 4C is a top plan view of an example SiC wafer 25c including a first major surface (e.g., an upper face) 26c. The first major surface 26c is opposite a second major surface (e.g., a lower face) not visible in FIG. 4C. A side surface 27c extends between the first major surface 26c and second major surface such that wafer 25c is laterally bounded by a generally circular peripheral edge having a diameter D. Side surface 27c may include a primary flat 28b (having a length L1) as well as a secondary flat 28c (having a length L2). Wafer 25c can have a different number of flats than illustrated in FIG. 4C, and the flats can also be formed in different locations than illustrated around the peripheral edge formed by side surface 27c. The edge shaping operations described herein can be applied to one or more edge portions of wafer 25c to form a shaped edge portion around some or all of the side surface 27c, including some or all of primary flat 28b and/or some or all of secondary flat 28c. In some embodiments, flats 28b and/or 28c can be formed by applying laser ablation to a substantially round wafer (e.g., SiC wafer 25a of FIG. 4A).

Figure 4D:
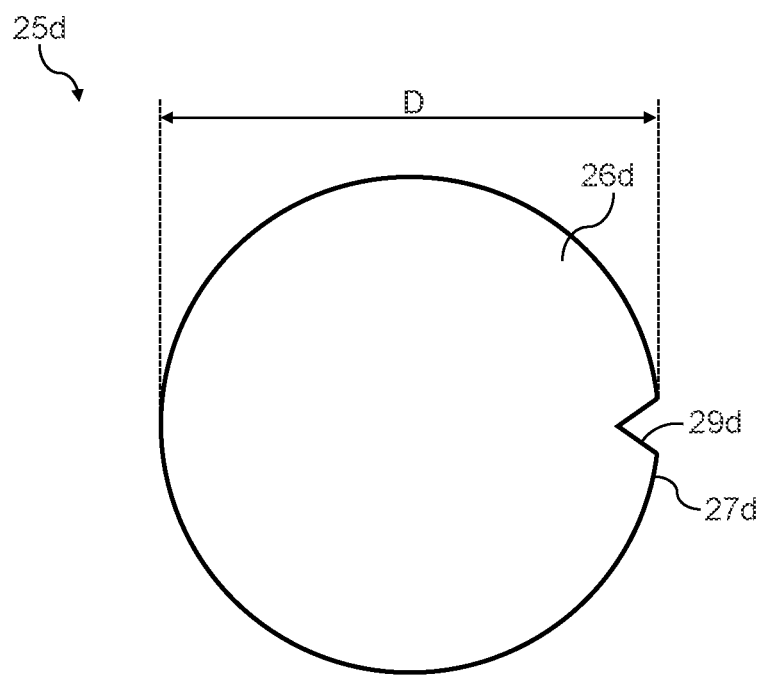
FIG. 4D is a top plan view of an example SiC wafer including a first example notch.

FIG. 4D is a top plan view of an example SiC wafer 25d including a first major surface (e.g., an upper face) 26d. The first major surface 26d is opposite a second major surface (e.g., a lower face) not visible in FIG. 4D. A side surface 27d extends between the first major surface 26d and second major surface such that wafer 25d is laterally bounded by a generally circular peripheral edge having a diameter D. Side surface 27d may include a notch 29d. Notch 29d is depicted as a V-shaped notch, although it should be appreciated that notches with other shapes can be formed. The edge shaping operations described herein can be applied to one or more edge portions of wafer 25d to form a shaped edge portion around some or all of the side surface 27d, including some or all of notch 29d. In some embodiments, notch 29d can be formed by applying laser ablation to a substantially round wafer (e.g., SiC wafer 25a of FIG. 4A).

Figure 4E:
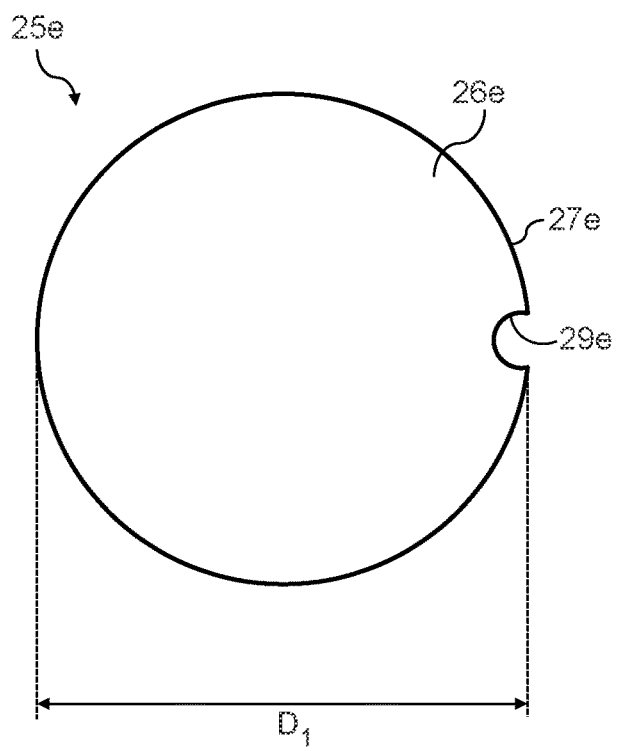
FIG. 4E is a top plan view of an example SiC wafer including a second example notch.

FIG. 4E is a top plan view of an example SiC wafer 25e including a first major surface (e.g., an upper face) 26e. The first major surface 26e is opposite a second major surface (e.g., a lower face) not visible in FIG. 4E. A side surface 27e extends between the first major surface 26e and second major surface such that wafer 25e is laterally bounded by a generally circular peripheral edge having a diameter D. Side surface 27e may include a notch 29e. Notch 29e is depicted as a C-shaped or semicircular notch, although it should be appreciated that notches with other shapes can be formed. The edge shaping operations described herein can be applied to one or more edge portions of wafer 25e to form a shaped edge portion around some or all of the side surface 27e, including some or all of notch 29e. In some embodiments, notch 29c can be formed by applying laser ablation to a substantially round wafer (e.g., SiC wafer 25a of FIG. 4A).

Figure 4F:
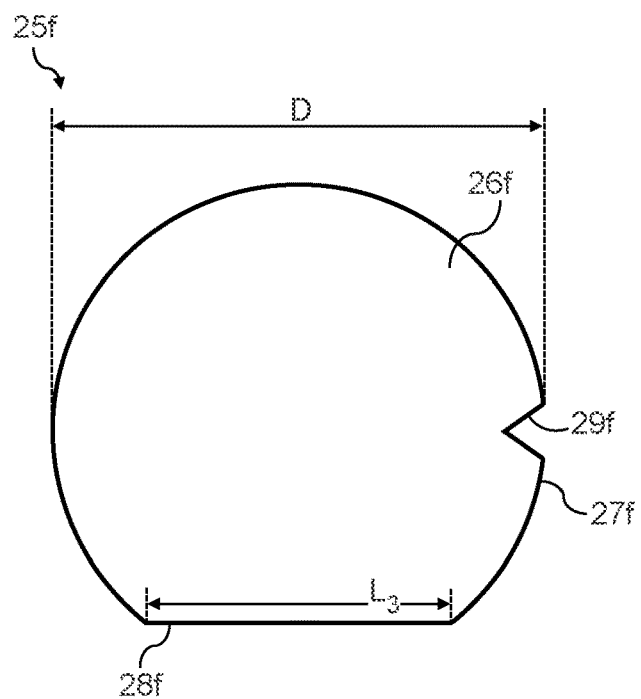
FIG. 4F is a top plan view of an example SiC wafer including an example notch and an example flat.

FIG. 4F is a top plan view of an example SiC wafer 25f including a first major surface (e.g., an upper face) 26f. The first major surface 26f is opposite a second major surface (e.g., a lower face) not visible in FIG. 4F. A side surface 27f extends between the first major surface 26f and second major surface such that wafer 25f is laterally bounded by a generally circular peripheral edge having a diameter D. Side surface 27f may include a primary flat 28f (having a length L3) as well as a notch 29f. Wafer 25f can have a different number of flats and/or notches than illustrated in FIG. 4F, and the flats and/or notches can also be formed in different locations than illustrated around the peripheral edge formed by side surface 27f. The edge shaping operations described herein can be applied to one or more edge portions of wafer 25f to form a shaped edge portion around some or all of the side surface 27c, including some or all of primary flat 28f and/or some or all of notch 29f. In some embodiments, flat 28f and/or notch 29f can be formed by applying laser ablation to a substantially round wafer (e.g., SiC wafer 25a of FIG. 4A).

It should be appreciated that the example SiC wafers depicted in FIGS. 4A-F are provided by way of example only, and variations to such wafers are within the spirit and scope of the disclosed technology. The SiC wafers may be on-axis or off-axis silicon carbide semiconductor wafers.

Methods disclosed herein may be applied to substrates of various crystalline materials, of both single crystal and polycrystalline varieties. In certain embodiments, methods disclosed herein may utilize cubic, hexagonal, or other crystal structures, and may be directed to crystalline materials having on-axis and off-axis crystallographic orientations. In certain embodiments, methods disclosed herein may be applied to semiconductor materials and/or wide bandgap materials. Example materials include, but are not limited to, Si, GaAs, and diamond.

In certain embodiments, such methods may utilize single crystal semiconductor materials having a hexagonal crystal structure, such as 4H-SiC, 6H-SIC, or Group III nitride materials (e.g., GaN, AlN, InN, InGaN, AlGaN, or AlInGaN). Various illustrative embodiments described hereinafter mention SiC generally or 4H-SiC specifically, but it is to be appreciated that any suitable crystalline material may be used. Among the various SiC polytypes, the 4H-SiC polytype is particularly attractive for power electronic devices due to its high thermal conductivity, wide bandgap, and isotropic electron mobility. Bulk SiC may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof such as 2 to 6 degrees or another subrange), as may be suitable for forming N-doped or highly conductive material).

Embodiments disclosed herein may apply to on-axis and off-axis crystalline materials, as well as doped and unintentionally doped crystalline semiconductor materials. Doped semiconductor material (e.g., n-doped SiC) exhibits some infrared absorption, thus requiring the use of higher laser power than undoped material to impart subsurface laser damage. In certain embodiments, crystalline material may include single crystal material, and may further include single crystal semiconductor material. Certain embodiments disclosed herein may utilize on-axis 4H-SiC or vicinal (off-axis) 4H-SiC having an offcut in a range from about 1 to about 10 degrees, or from about 2 to about 6 degrees, such as about 4 degrees.

FIGS. 5A-5H depict example edge profiles formed in accordance with a laser edge shaping system of the present disclosure. Although several example edge profiles are depicted, still further edge profiles may be achieved in accordance with the disclosed edge shaping technology. As such, the example edge profiles of FIGS. 5A-5H are not intended to limit the scope of the disclosed technology.

Figure 5B:
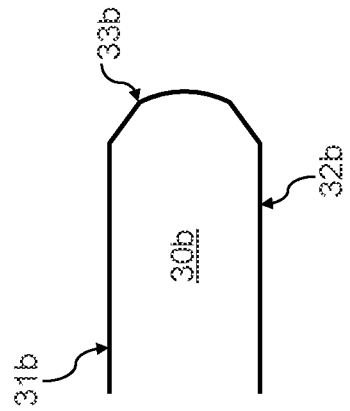
FIG. 5A-5H depict example edge profiles formed in accordance with a laser edge shaping system of the present disclosure.
Figure 5D:
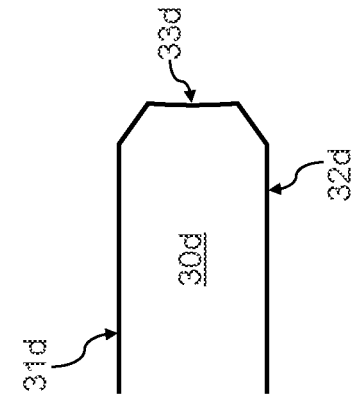
Figure 5A:
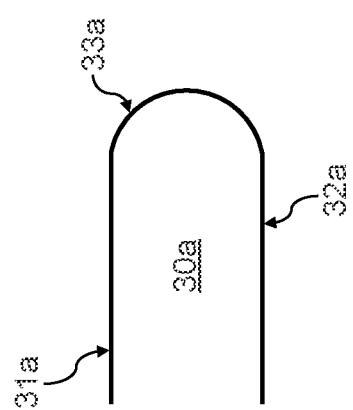

FIG. 5A is a partial side view of an example wafer 30a including a first major surface (e.g., an upper face) 31a formed opposite a second major surface (e.g., a lower face) 32a. A side surface 33a extends between the first major surface 31a and second major surface 32a to form an edge of the wafer 30a. A laser shaping operation in accordance with the disclosed technology may be applied to an unfinished edge surface such that the side surface 33a is formed to have a predefined edge profile that is rounded.

FIG. 5B is a partial side view of an example wafer 30b including a first major surface (e.g., an upper face) 31b formed opposite a second major surface (e.g., a lower face) 32b. A side surface 33b extends between the first major surface 31b and second major surface 32b to form an edge of the wafer 30b. A laser shaping operation in accordance with the disclosed technology may be applied to an unfinished edge surface such that the side surface 33b is formed to have a predefined edge profile that is beveled.

Figure 5C:
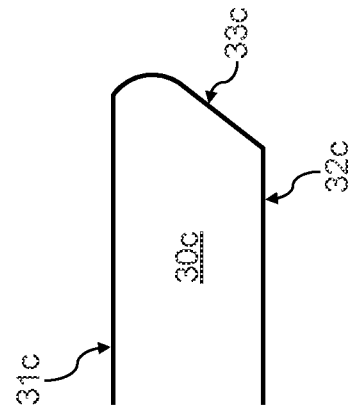

FIG. 5C is a partial side view of an example wafer 30c including a first major surface (e.g., an upper face) 31c formed opposite a second major surface (e.g., a lower face) 32c. A side surface 33c extends between the first major surface 31c and second major surface 32c to form an edge of the wafer 30c. A laser shaping operation in accordance with the disclosed technology may be applied to an unfinished edge surface such that the side surface 33c is formed to have a predefined edge profile that is asymmetrically tapered with more extension towards the first major surface 31c.

FIG. 5D is a partial side view of an example wafer 30d including a first major surface (e.g., an upper face) 31d formed opposite a second major surface (e.g., a lower face) 32d. A side surface 33d extends between the first major surface 31d and second major surface 32d to form an edge of the wafer 30d. A laser shaping operation in accordance with the disclosed technology may be applied to an unfinished edge surface such that the side surface 33d is formed to have a predefined edge profile that is symmetrically tapered.

Figure 5F:
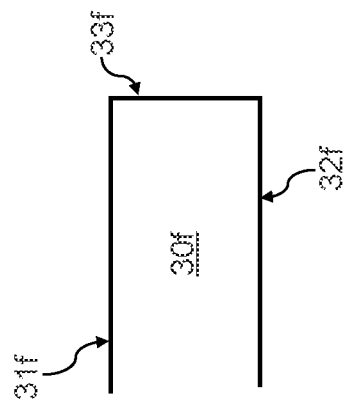
Figure 5H:
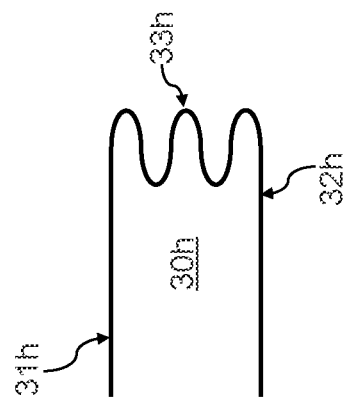
Figure 5E:
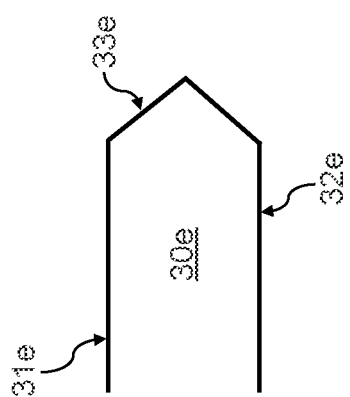

FIG. 5E is a partial side view of an example wafer 30e including a first major surface (e.g., an upper face) 31e formed opposite a second major surface (e.g., a lower face) 32c. A side surface 33e extends between the first major surface 31e and second major surface 32e to form an edge of the wafer 30e. A laser shaping operation in accordance with the disclosed technology may be applied to an unfinished edge surface such that the side surface 33e is formed to have a predefined edge profile that is tapered in a generally triangular shape.

FIG. 5F is a partial side view of an example wafer 30f including a first major surface (e.g., an upper face) 31f formed opposite a second major surface (e.g., a lower face) 32f. A side surface 33f extends between the first major surface 31f and second major surface 32f to form an edge of the wafer 30f. A laser shaping operation in accordance with the disclosed technology may be applied to an unfinished edge surface such that the side surface 33f is formed to have a predefined edge profile that is substantially flat or perpendicular.

Figure 5G:
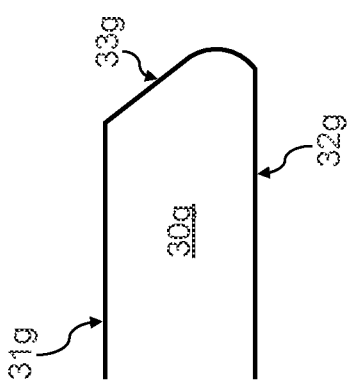

FIG. 5G is a partial side view of an example wafer 30g including a first major surface (e.g., an upper face) 31g formed opposite a second major surface (e.g., a lower face) 32g. A side surface 33g extends between the first major surface 31g and second major surface 32g to form an edge of the wafer 30g. A laser shaping operation in accordance with the disclosed technology may be applied to an unfinished edge surface such that the side surface 33g is formed to have a predefined edge profile that is asymmetrically tapered with more extension towards the second major surface 32g.

FIG. 5H is a partial side view of an example wafer 30h including a first major surface (e.g., an upper face) 31h formed opposite a second major surface (e.g., a lower face) 32h. A side surface 33h extends between the first major surface 31h and second major surface 32h to form an edge of the wafer 30h. A laser shaping operation in accordance with the disclosed technology may be applied to an unfinished edge surface such that the side surface 33h is formed to have a predefined edge profile that has one or more channels. It should be appreciated that although the example edge profile of FIG. 5H depicts wave-shaped or sinusoidalshaped channels, alternative channels such as square-shaped channels, V-shaped or triangular-shaped channels, etc. may be formed in accordance with the disclosed edge shaping technology. The number of channels and pitch among channels may also be varied within a predefined edge profile.

Figure 6A:
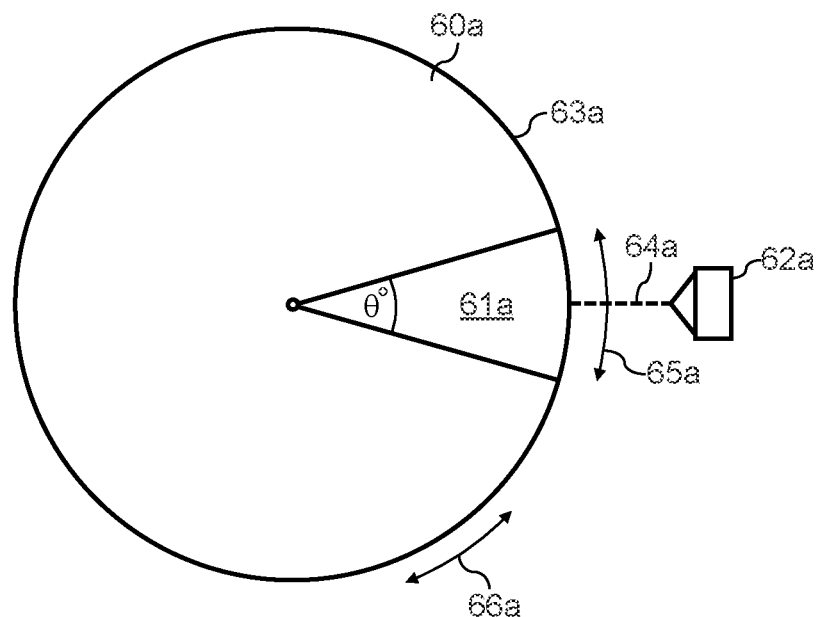
FIG. 6A is a top plan view of an example semiconductor wafer and laser source configured to implement edge shaping in azimuthal sections according to examples of the present disclosure.

FIG. 6A is a top plan view of an example semiconductor wafer 60a and laser source 62a emitting a laser 64a configured to implement edge shaping in azimuthal sections according to examples of the present disclosure. More particularly, to perform the laser ablation process described herein, relative motion may be imparted between the semiconductor wafer 60a and the laser(s) 64a ablating the edge portions thereof. Both moving the laser 64a relative to a side surface 63a of the semiconductor wafer 60a and/or moving the side surface 63a relative to the laser(s) 64a may fall within the scope of the present disclosure. During a laser-based edge shaping operation according to examples of the present disclosure, the laser 64a may, for example, scan an azimuthal section 61a (e.g., a section of about 0 degrees or less) by controlling mirrors in the laser source 62a such that motion of the laser 64a is maneuvered within range 65a. Motion may then be applied to a workplace carrier 66a or other fixture on which the semiconductor wafer 60a is mounted to orient the laser 64a towards another azimuthal section (e.g., another section of about 0 degrees or less adjacent to section 61a). In some examples, the edge portion of the semiconductor wafer 60a may be ablated within each of a plurality of azimuthal sections 61a of the semiconductor wafer 60a in a predetermined (e.g., sequential) manner. For instance, each azimuthal section 61a can be ablated in a plurality of vertical scans across the azimuthal section 61a. However, the scans may be in other directions (e.g., horizontal, angled) without deviating from the scope of the present disclosure. In some embodiments, each azimuthal section 61a may be in a range of about 5 degrees to about 60 degrees, about 60 degrees or less, about 30 degrees or less, about 20 degrees or less, about 10 degrees or less, or about 5 degrees or less.

Figure 6B:
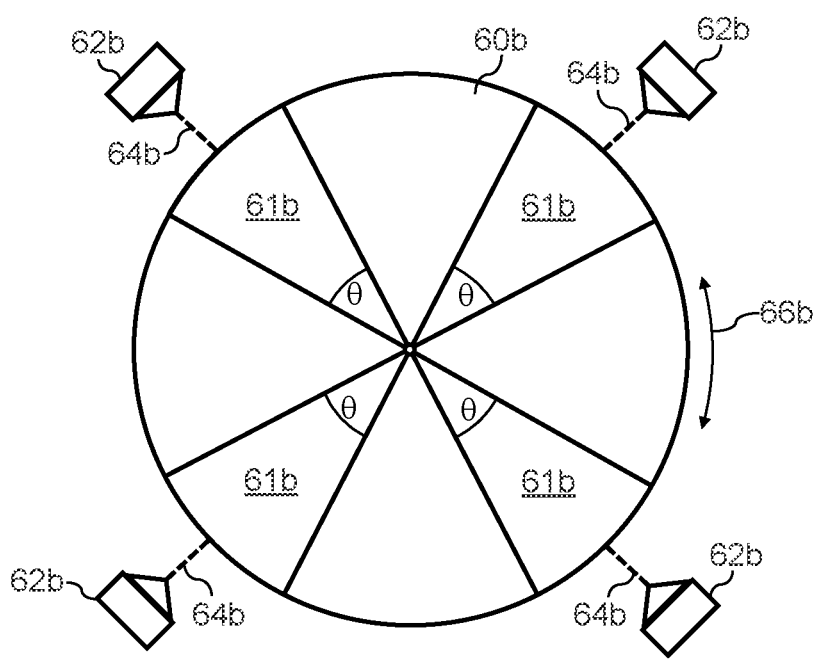
FIG. 6B is a top plan view of an example semiconductor wafer and multiple laser sources configured to implement edge shaping according to examples of the present disclosure.

FIG. 6B is a top plan view of an example semiconductor wafer 60b and multiple laser sources 62b configured to implement edge shaping with ablation by respective lasers 64b according to examples of the present disclosure. The multiple lasers 64b may include two or more lasers 64b (e.g., two lasers, three lasers, four lasers as depicted in FIG. 6B, etc.) provided at different positions around the periphery of a semiconductor wafer 60b in order to ablate different edge portions simultaneously or at coordinated intervals. In some examples, multiple lasers 64b can be advantageous to reduce a total ablation time for edge shaping compared to a single laser. Each laser source 62b and corresponding laser 64b may be configured to operate in accordance with the same laser parameters or different laser parameters (e.g., different wavelengths). For instance, in one example embodiments, one or more first laser sources 62b may emit a respective first laser 64b to implement a coarse laser ablation process. One or more second laser sources 62b may emit a respective second laser 64b to implement a fine laser ablation process.

Figure 6C:
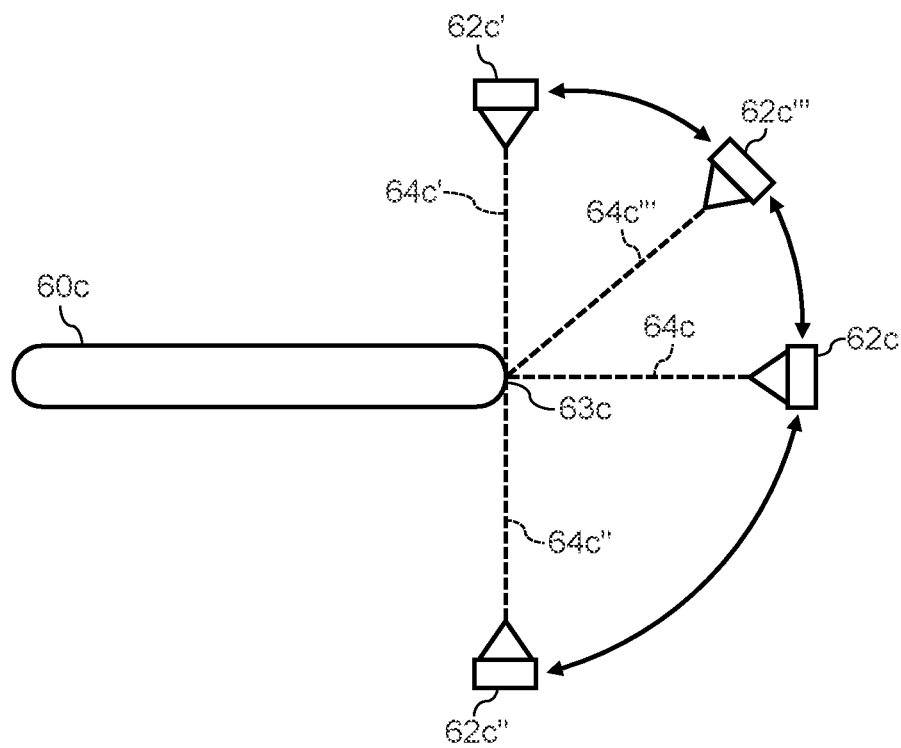
FIG. 6C is a side view of an example semiconductor wafer and translatable laser source configured to implement edge shaping according to examples of the present disclosure.

FIG. 6C is a side view of an example semiconductor wafer 60c and one or more translatable laser sources 62c respectively emitting a laser 64c configured to implement edge shaping of side surface 63a according to examples of the present disclosure. More particularly, FIG. 6C depicts laser 62c in a first position such that laser 62c emits laser beam 64c in a direction substantially parallel to the first and second major surfaces of semiconductor wafer 60c. For reference purposes, the first position of laser 62c is oriented in a manner to emit laser 64c at an angle of zero degrees (0°) relative to side surface 63c. The laser 62c may be translated (e.g., rotated along a substantially circular axis as depicted or otherwise moved or repositioned) such that the laser is capable of emitting a laser at one or more different angles relative to the base position of laser 62c. In some instances, laser 62c is translatable to be positioned at an angle+/−90 degrees relative to side surface 63c. For instance, laser 62c' is positioned to emit a laser beam 64c' in a direction substantially perpendicular to the first major surface of the semiconductor wafer 60c. For reference purposes, the position of laser 62c' is oriented in a manner to emit laser 64c' at an angle of +90 degrees (90°) relative to side surface 63c. Laser 62c" is positioned to emit a laser beam 64c" in a direction substantially perpendicular to the second major surface of the semiconductor wafer 60c. For reference purposes, the position of laser 62c" is oriented in a manner to emit laser 64c" at an angle of −90 degrees (−90°) relative to side surface 63c. Laser 62c''' is positioned to emit a baser beam 64c''' at an angle of +45 degrees (+45°) relative to side surface 63c. Although a subset of example translatable laser positions are shown, laser 62c can be moved or translated to any particular orientation or set of multiple orientations during the disclosed laser ablation process to accomplish a desired edge shaping for a semiconductor wafer.

During a laser-based edge shaping operation according to examples of the present disclosure, the lasers 64b may, for example, respectively scan azimuthal sections 61b (e.g., sections of about 0 degrees or less) by controlling mirrors or other optics associated with the laser sources 62b. Motion may then be applied to a workplace carrier 66b or other fixture on which the semiconductor wafer 60b is mounted to orient the lasers 64b towards another set of azimuthal sections (e.g., other sections of about 0 degrees or less adjacent to sections 61b). In some examples, the edge portion of the semiconductor wafer 60b may be ablated within each of a plurality of azimuthal sections 61b of the semiconductor wafer 60b in a predetermined (e.g., sequential) manner. For instance, each azimuthal section 61b can be ablated in a plurality of vertical scans across the azimuthal section 61b. However, the scans may be in other directions (e.g., horizontal, angled) without deviating from the scope of the present disclosure. In some embodiments, each azimuthal section 61b may be in a range of about 5 degrees to about 30 degrees, about 30 degrees or less, about 20 degrees or less about 10 degrees or less, or about 5 degrees or less.

Figure 7A:
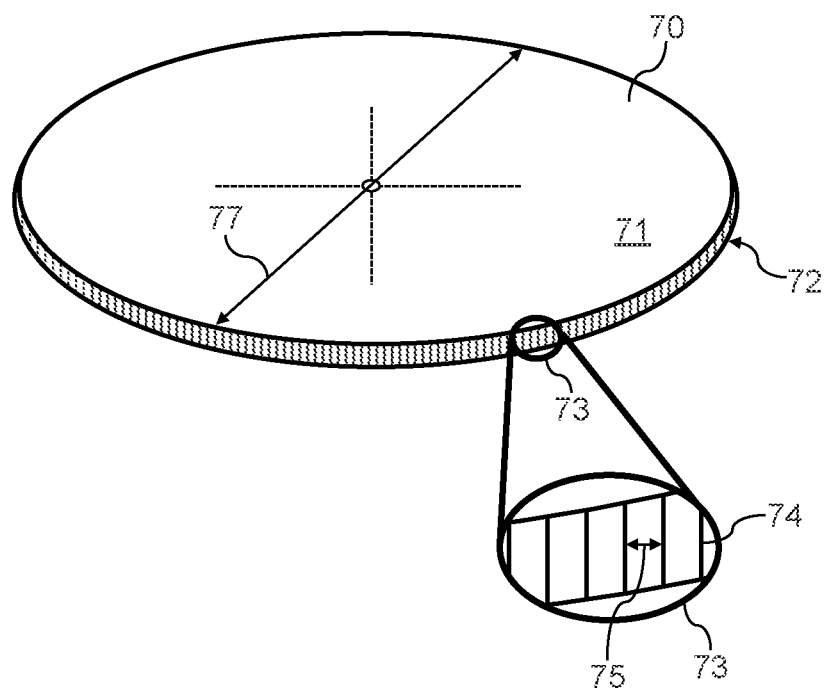
FIG. 7A is a perspective view of a semiconductor wafer according to examples of the present disclosure.

FIG. 7A is a perspective view of a semiconductor wafer 70 that has been subjected to a laser-based edge shaping operation according to examples of the present disclosure. The semiconductor wafer 70 may include a silicon carbide structure defined by first and second opposing major surfaces 71 and a peripheral edge 72. A laser-defined surface 73 may be formed along at least a portion of the peripheral edge 72 of the silicon carbide structure. In some examples, the semiconductor wafer 70 may include, for instance, 4H silicon carbide or 6H silicon carbide.

The laser-defined surface 73 may span the thickness between the first and second opposing major surfaces 71 at the portion of the peripheral edge 72 of the silicon carbide structure. In some examples, the laser-defined surface 73 may have a surface roughness in a range of about 0.5 nanometers to about 65 microns, such as about 0.1 micron to about 1 micron. In some instances, the surface roughness may be in a range of about 0.5 nanometers to about 125 nanometers, such as about 1 nanometer and about 100 nanometers, such as about 2 nanometers and about 50 nanometers. In some examples, the laser-defined surface 73 formed along at least the portion of the peripheral edge 72 of the silicon carbide structure has a defined edge profile (e.g., a beveled edge, a rounded edge, other non-perpendicular edge or any of the edge profiles depicted in FIGS. 5A-5D).

In some examples, the laser-defined surface 73 may include a plurality of strips 74 arranged in a repeating pattern on the laser-defined surface 73. The plurality of strips 74 may extend vertically, horizontally, or at an angle between the first and second opposing major surfaces 71 of the silicon carbide structure forming semiconductor wafer 70. However, other suitable orientations of the strips may be used without deviating from the scope of the present disclosure. The repeating pattern of the plurality of strips 74 may correspond to the scanning path of a laser during an edge shaping operation. Each strip may have a width 75 corresponding generally to a scan dimension associated with the laser during the laser scan. The width 75 may be about 10 microns to about 25 millimeters, such as about 10 microns to about 1 millimeter, such as about 10 microns to about 100 microns.

In some examples, the portion of the peripheral edge 72 of the silicon carbide structure has a defined diameter 77 around the portion of the peripheral edge 72. In some examples, the diameter 77 of the semiconductor wafer 70 is between about 100 millimeters and about 300 millimeters, such as in a range of between about 100 millimeters and about 200 millimeters, such as about 100 millimeters, such as about 150 millimeters, or such as about 200 millimeters. The semiconductor wafer 70 may have a thickness of less than about 500 microns, such as less than about 300 microns, such as less than about 200 microns, such as in a range of about 100 microns to about 200 microns, such as in a range of about 120 microns to 180 microns.

Figure 7B:
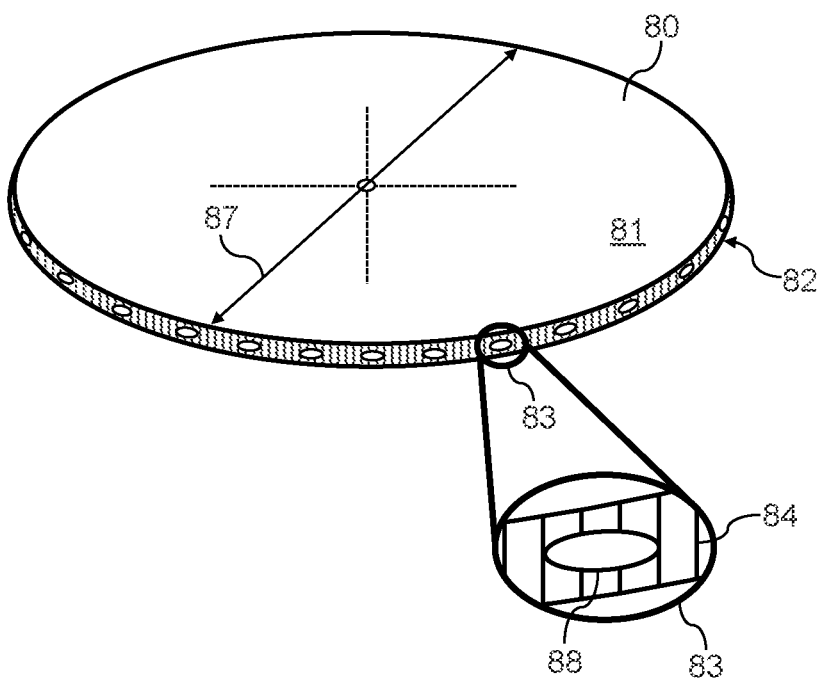
FIG. 7B is a perspective view of a semiconductor wafer with strain relief and/or cooling features according to examples of the present disclosure.

FIG. 7B is a perspective view of a semiconductor wafer 80 that has been subjected to a laser-based edge shaping operation and that includes strain relief and/or cooling features 88 according to examples of the present disclosure. The semiconductor wafer 80 may include a silicon carbide structure defined by first and second opposing major surfaces 81 and a peripheral edge 82. In some examples, the semiconductor wafer 80 may include, for instance, 4H silicon carbide or 6H silicon carbide. A laser-defined surface 83 may be formed along at least a portion of the peripheral edge 82 of the silicon carbide structure. In some examples, the plurality of strain relief and/or cooling features 88 may be formed after forming the laser-defined surface 83. The strain relief and/or cooling features 88 may be formed by laser ablation using the same laser edge shaping system and methods described herein.

Referring still to semiconductor wafer 80, the portion of the peripheral edge 82 of the silicon carbide structure may have one or more strain relief features or one or more cooling features formed therein. For example, as depicted in FIG. 7B, the peripheral edge 82 includes a plurality of features 88 corresponding to areas within peripheral edge 82 where extra material is removed from the side surface of the semiconductor wafer 80. In some examples, the plurality of features 88 may be generally uniform relative to one another. In some examples, each of the plurality of features 88 may have a different shape. In some examples, the plurality of features 88 may be spaced at periodic locations along the peripheral edge 82 (e.g., at regular or irregular intervals). When the plurality of features 88 are configured as strain relief features, the plurality of features 88 may help to relieve stress forces that could be imposed upon the semiconductor wafer 80 in certain manufacturing or operation conditions. When the plurality of features 88 are configured as cooling features, the plurality of features 88 may help to provide thermal dissipation when excess heat is encountered by the semiconductor wafer 80 during certain manufacturing or operating conditions.

The laser-defined surface 83 may span the thickness between the first and second opposing major surfaces 81 at the portion(s) of the peripheral edge 82 of the silicon carbide structure. In some examples, the laser-defined surface 83 may have a surface roughness in a range of about 0.5 nanometers to about 65 microns, such as about 0.1 micron to about 1 micron. In some instances, the surface roughness may be in a range of about 0.5 nanometers to about 125 nanometers, such as about 1 nanometer and about 100 nanometers, such as about 2 nanometers and about 50 nanometers. In some examples, the laser-defined surface 83 formed along at least the portion(s) of the peripheral edge 82 of the silicon carbide structure has a defined edge profile (e.g., a beveled edge, a rounded edge, other non-perpendicular edge or any of the edge profiles depicted in FIGS. 5A-5D).

In some examples, the laser-defined surface 83 may include a plurality of strips 84 arranged in a repeating pattern on the laser-defined surface 83. The plurality of strips 84 may extend vertically, horizontally, or at an angle between the first and second opposing major surfaces 81 of the semiconductor wafer 80 except for locations corresponding to the plurality of features 88. The repeating pattern of the plurality of strips 84 may correspond to the scanning path of a laser during an edge shaping operation. Each strip may have a width corresponding generally to a scan dimension associated with the laser during the laser scan.

In some examples, the portion of the peripheral edge 82 of the semiconductor wafer has a defined diameter 87 around the portion of the peripheral edge 82. In some examples, the diameter 87 of the semiconductor wafer 80 is between about 100 millimeters and about 300 millimeters, such as in a range of between about 100 millimeters and about 200 millimeters, such as about 100 millimeters, such as about 150 millimeters, or such as about 200 millimeters. The semiconductor wafer 80 may have thickness of less than about 500 microns, such as less than about 300 microns, such as less than about 200 microns, such as in a range of about 100 microns to about 200 microns, such as in a range of about 120 microns to 180 microns.

Figure 8:
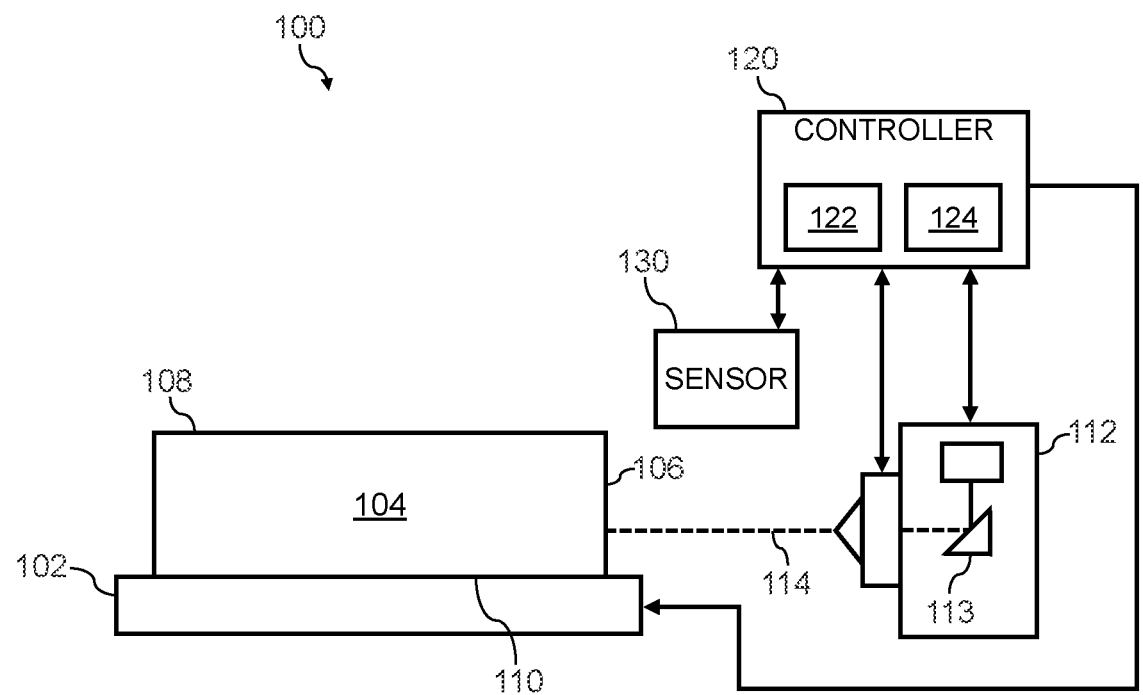
FIG. 8 depicts an example laser edge shaping system according to examples of the present disclosure.

FIG. 8 depicts an example laser edge shaping system 100 according to examples of the present disclosure. The laser edge shaping system 100 may be configured to implement one or more aspects of the present disclosure, such as the laser-based ablation processes and/or laser edge shaping processes disclosed herein. In general, the laser edge shaping system 100 is configured for forming a semiconductor wafer (e.g., by shaping edges of a semiconductor wafer). The laser edge shaping system 100 includes a workpiece support 102 configured to support a workpiece (e.g., semiconductor wafer 104). The workpiece support 102 may include a chuck (e.g., vacuum chuck) or other mechanism to hold the semiconductor wafer 104 in place during laser processing according to examples of the present disclosure. The semiconductor wafer 104 has a side surface 106 extending between a first major surface 108 and an opposing second major surface 110.

The laser edge shaping system 100 further includes a laser source 112 configured to emit a laser 114 towards an edge portion of the semiconductor wafer 104 from a direction facing the side surface 106 of the semiconductor wafer 104. The laser source 112 is further configured to ablate the edge portion of the semiconductor wafer 104 with the laser 114.

The laser 114 may be configured with various laser parameters. The laser parameters of the laser 114 may include, for instance, focusing depth, laser power, laser wavelength, laser pulse duration, laser pulse frequency, laser pulse energy, etc. The laser source 112 may be associated with one or more wavelengths and may be, for instance, one or more of a excimer laser, UV laser, visible light laser, infrared laser, single wavelength laser, multiwavelength laser, white laser, etc. The laser source 112 may be associated with a pulse duration and may be, one or more of an attosecond laser, femtosecond laser, nanosecond laser, etc. The laser source 112 may be associated with a lasing medium and may be, for instance, a gas (e.g., $CO_2$) laser, solid state laser (e.g., GaN, AlGaN, YAG, etc.), diode laser, fiber laser, etc. The laser source 112 may be one or more of a single frequency laser, frequency doubled laser, frequency tripled laser, frequency quadrupled laser, etc. Although only a single laser source 112 and laser 114 are depicted in FIG. 8, it should be appreciated that multiple lasers as described herein may be employed.

Additionally, in some examples, the laser edge shaping system 100 may include one or more control devices, such as a controller 120. The controller 120 may be configured to perform various operations relative to the workpiece support 102, the semiconductor wafer 104, and/or the laser source 112. For instance, the controller 120 may obtain data indicative of a defined edge profile for the semiconductor wafer 104. The controller 120 may then determine one or more laser ablation parameters based on the data indicative of the defined edge profile and control the laser 114 (by way of controlling the laser source 112) to ablate the edge portion of the semiconductor wafer based at least in part on the one or more laser ablation parameters. Laser ablation parameters may include, for example, one or more particular positions on the side surface of the semiconductor wafer and/or one or more operating characteristics of the laser (e.g., focusing depth, laser power, laser wavelength, laser pulse duration, laser pulse frequency, laser pulse energy, and/or translation speed).

The controller 120 may include one or more processors 122 and one or more memory devices 124. The one or more memory devices 124 may store computer-readable instructions that when executed by the one or more processors 122 cause the one or more processors 122 to perform one or more control functions, such as any of the functions described herein. The controller 120 may be in communication with various other aspects of the laser edge shaping system 100 through one or more wired and/or wireless control links. The controller 120 may send control signals to the various components of the laser edge shaping system 100 (e.g., the laser source 112, the workpiece support 102, the sensor 130) to implement a laser edge shaping operation on the semiconductor wafer 104.

The controller 120 may be configured to move the laser source 112 and/or the laser 114 relative to the semiconductor wafer 104. For example, the laser source 112 may include one or more optics 113 (e.g., lens, mirrors, etc.) to facilitate moving the laser 114 from the laser source 112 relative to the semiconductor wafer 104. For example, the laser source 112 may use the one or more optics 113 to move the laser 114 within a particular azimuthal section of the semiconductor wafer 104. In some examples, the one or more optics 113 may be adaptive optics that may include one or more lenses, mirrors, or other optical devices. The lenses, mirrors, or other optical devices may be moved or adjusted to adjust one or more of the one or more laser parameters. For instance, the one or more lenses may be swapped or adjusted to change a focal depth of the laser.

In addition, or in the alternative, the workpiece support 102 may be operable to move the semiconductor wafer 104 relative to the one or more lasers 114, for example, by rotating the semiconductor wafer 104 to a different position or azimuthal section. In this way, the laser edge shaping system 100 may be able to control the laser source 112 and/or the workpiece support 102 to impart relative motion between the laser 114 and the semiconductor wafer to implement laser-based edge shaping processes and/or laser ablation processes according to examples of the present disclosure.

Additionally, in some examples, the system may include a sensor 130 operable to obtain sensor data indicative of a current state of the edge portion of the semiconductor wafer 104. The controller 120 may be further configured to adjust the laser ablation parameters based at least in part on the sensor data obtained from the sensor 130. For instance, in some embodiments, the sensor 130 may be an optical sensor, image capture device, or one or more surface measurement lasers. The sensor 130 may be used to determine a surface topography of the ablated side surface 106.

In some embodiments, the sensor 130 may include, for instance, an optical sensor, such as an image capture device (e.g., camera) that may capture images at one or more wavelengths of visible light and/or ultraviolet or infrared light. In some embodiments, the sensor 130 may include one or more surface measurement lasers that may be operable to emit a laser onto the side surface 106 of the semiconductor wafer 104 and scan the surface (based on reflections of the laser) for depth measurements, topography measurements, etc. of the side surface 106 of the semiconductor wafer 104. Other suitable sensors may be used without deviating from the scope of the present disclosure.

In some embodiments, the controller 120 may control aspects of the laser edge shaping system 100 (e.g., the laser source 112) based at least in part on data from the sensor 130. For instance, the controller 120 may adjust various laser parameters for the laser 114 emitted by the laser source 112 based at least in part on data from the sensor 130. The laser parameters may include, for instance, one or more of focusing depth, laser power, laser wavelength, laser pulse duration, laser pulse frequency, laser pulse energy, translation speed. In some embodiments, the laser parameters may include an incidence angle of the laser 114 on the side surface 106 of the semiconductor wafer 104.

In some examples, the controller 120 may be configured to adjust one or more laser parameters based on sensor data associated with a current workpiece (e.g., semiconductor wafer 104) undergoing a laser-based surface processing operation (e.g., dynamic adjustment during or after a laser-based surface processing operation) or based on sensor data associated with past semiconductor workpieces that had previous undergone a laser-based surface processing operation.

In some examples, the laser source 112 may be dynamically adjusted, or tuned, during a laser surface processing operation. The sensor 130 may provide sensor data to the controller 120 and the controller 120 may determine, or adjust, one or more laser parameters for the laser 114 based on the sensor data while performing the laser surface processing operation. For instance, the sensor 130 may provide data indicative of a surface topography of the workpiece to the controller 120 while the laser 114 is processing the surface of the workpiece. The controller 120 may then adjust one or more laser parameters of the laser 114 based on the received surface topography while the laser 114 is still processing the surface of the workpiece. In this way, the one or more laser parameters may be dynamically adjusted, or tuned, during laser surface processing operations.

In some examples, the one or more laser parameters of the laser source 112 may be adaptively tuned, or adjusted, through multiple laser surface processing operations. The sensor 130 may aggregate data regarding the workpiece before, during, and after a laser surface processing operation and provide it to the controller 120. The controller 120 may then tune one or more laser parameters of the laser source 112 based on the aggregated data from the sensor 130. For instance, the laser source 112 may include a set of one or more laser parameters for a laser surface processing operation. The laser source 112 may perform a laser surface processing operation on the surface of a workpiece and the sensor 130 may obtain data regarding the surface of the workpiece after the operation. The data regarding the surface of the workpiece may then be provided to the controller 120 which may adjust, or tune, one or more of the set laser parameters associated with the laser source 112 and reprocess the surface of the workpiece. In some examples, the one or more laser parameters may be adaptively tuned for future laser surface processing operations and/or future additional workpiece(s). For instance, the controller 120 may determine one or more laser parameter adjustments based on one or more laser surface processing operations on a first workpiece and apply the adjustments to one or more laser parameters for a laser surface processing operation on a second workpiece.

Figure 9:
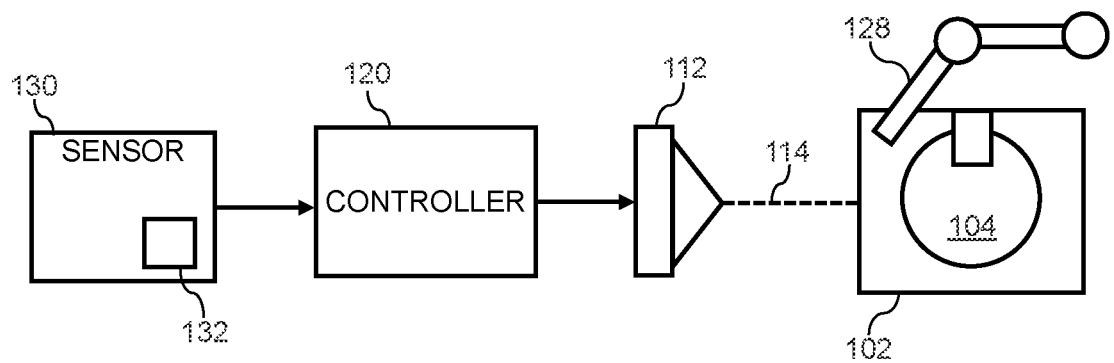
FIG. 9 depicts example control of a laser based on sensor data according to examples of the present disclosure.

FIG. 9 depicts an overview of example control of a laser source 112 based at least in part on sensor data 132 from the sensor 130 according to examples of the present disclosure. As shown, the sensor data 132 may be provided to the controller 120 (e.g., through a communication link). The sensor data 132 may include, for instance, surface characterization data that provides information associated with the side surface 106 of the semiconductor wafer 104, such as topography, surface roughness, current state of an edge profile, diameter of the semiconductor wafer 104, presence of anomalies, etc. Sensor data 132 may include, for instance, an image of the side surface 106 of the semiconductor wafer 104 and/or a surface topographical of the side surface 106 of the semiconductor wafer 104. The controller 120 may be used to align the semiconductor wafer 104 relative to the workpiece support 102 and/or implement mechanical translation of workpiece support 102 relative to the semiconductor wafer 104 by sending electronic control signals to robotic arms 128 or other mechanical features.

The controller 120 may determine one or more laser parameters for the laser 114 emitted by the laser source 112 on the side surface 106 of the semiconductor wafer 104 based on the sensor data 132. For instance, in some embodiments, the controller 120 may access a model, algorithm, function, lookup table, machine-learned model, etc., that correlates one or more laser parameters based on the sensor data and/or position on the side surface 106 of the semiconductor wafer 104.

In some embodiments, the one or more laser parameters are specified as a function of both a position on the side surface 106 of the semiconductor wafer 104 and sensor data 132 associated with that specific position. For instance, the controller 120 may determine a first set of laser parameters for the laser 114 for ablating or removing material at a first position (e.g., in a first azimuthal section) on the semiconductor wafer 104. The controller 120 may determine a second set of laser parameters for the laser 114 for ablating or removing material at a second position (e.g., in a second azimuthal section) on the semiconductor wafer 104. The first set of laser parameters may be different or the same as the second set of laser parameters.

In this way, the laser parameters may be continuously adjusted or tuned to perform ablation and/or edge shaping based on surface characterization at a specific position on the semiconductor wafer 104. In some embodiments, this may provide, for instance, use of high laser power for a first position on the semiconductor wafer 104 relative to a second position on the semiconductor wafer 104. In some embodiments, this may provide, for instance, use of a first incidence angle of the laser 114 relative to the semiconductor wafer 104 at a first position on the side surface 106 and a second incidence angle of the laser 114 relative to the semiconductor wafer 104 at a second position on the side surface 106. In some embodiments, this may provide, for instance, use of a first laser source operable to emit a laser associated with a first wavelength (e.g., infrared wavelength) at a first position and use of a second laser source operable to emit a laser associated with a second wavelength (e.g., ultraviolet wavelength) at a second position. A variety of laser parameters (e.g., focusing depth, laser power, laser wavelength, laser pulse duration, laser pulse frequency, translation speed, laser pulse energy, laser incidence angle) may be adjusted as a function of position on the side surface 106 of the semiconductor wafer 104 and/or sensor data without deviating from the scope of the present disclosure.

Figure 10:
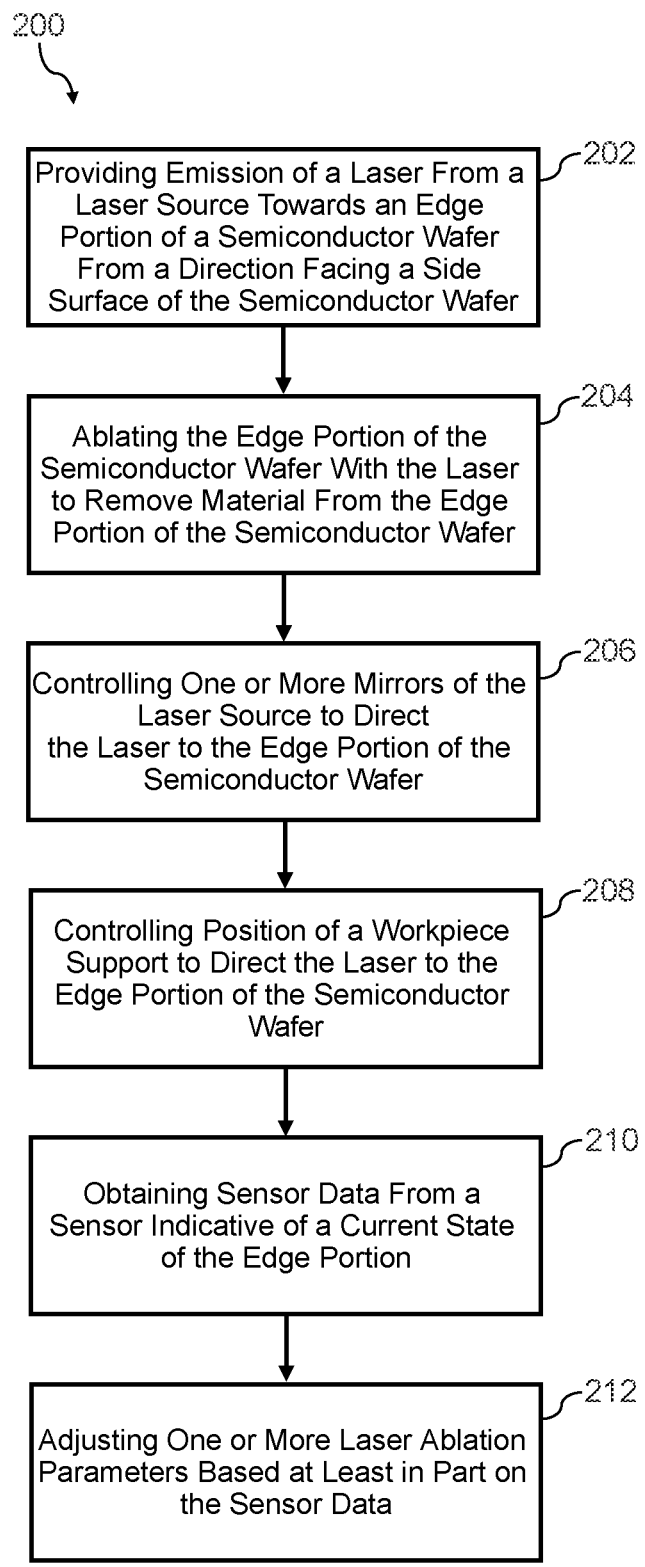
FIG. 10 depicts a flow chart diagram of an example method according to examples of the present disclosure.

FIG. 10 depicts a flow chart diagram of an example method 200 according to aspects of the present disclosure. The method 200 includes operations illustrated in a particular order for purposes of illustration and discussion. Those of ordinary skill in the art, using the disclosures provided herein, will understand that the various steps or operations of any of the methods provided in this disclosure may be adapted, rearranged, omitted, include steps not illustrated, and/or modified in various ways without deviating from the scope of the present disclosure.

At 202, the method 200 includes providing emission of a laser from a laser source towards an edge portion of a semiconductor wafer from a direction facing a side surface of the semiconductor wafer. In some embodiments, the semiconductor wafer towards which the laser is emitted at 202 may be a wide bandgap semiconductor workpiece including a silicon carbide and/or a Group III-nitride.

In some examples, a direction facing the side surface of the semiconductor wafer towards which the laser is emitted at 202 may correspond to any direction that intersects a side surface prior to any other surface on the semiconductor wafer. Other surfaces may include first and second major surfaces of the semiconductor wafer, between which the side surface may extend. A relative arrangement of the laser and associated surfaces of the semiconductor wafer may be appreciated by positioning the laser source to output the laser in a first plane that is generally parallel to respective planes defined by the first major surface and the opposing second major surface of the semiconductor wafer.

At 204, the method 200 includes ablating the edge portion of the semiconductor wafer with the laser to remove material from the edge portion of the semiconductor wafer. For instance, the edge portion of the semiconductor wafer may be ablated at 204 to have a defined edge profile (e.g., a beveled edge, a rounded edge, or other non-perpendicular edge or any of the edge profiles depicted in FIGS. 5A-5D).

Additionally, or alternatively, the edge portion of the semiconductor wafer may be ablated at 204 to reduce a surface roughness of the edge portion of the semiconductor wafer. For example, ablation of the edge portion of the semiconductor wafer may form a shaped edge portion having a surface with a surface roughness in a range about 0.5 nanometers to about 65 microns, such as about 0.1 micron to about 1 micron. In some instances, the surface roughness may be in a range of about 0.5 nanometers to about 125 nanometers, such as about 1 nanometer and about 100 nanometers, such as about 2 nanometers and about 50 nanometers.

Additionally, or alternatively, the edge portion of the semiconductor wafer may be ablated at 204 to form a defined diameter around a peripheral edge portion of the semiconductor wafer. For example, the defined diameter around the peripheral edge portion may be in a range of about 150 millimeters to about 300 millimeters, such as in a range of about 150 millimeters to about 200 millimeters, such as about 150 millimeters, or such as about 200 millimeters.

In some examples, the edge portion of the semiconductor wafer may be ablated at 204 to form a shaped wafer edge. The shaped wafer edge may have one or more strain features for relieving stress forces that could be imposed upon the wafer in certain manufacturing or operation conditions. The shaped wafer edge may have one or more cooling features for providing thermal dissipation when excess heat is encountered during certain manufacturing or operating conditions.

In some examples, the edge portion of the semiconductor wafer may be ablated at 204 at a fixed focal depth at or near the side surface. The focal depth may be a depth within about 0 microns (e.g., on the side surface) to about 1000 microns past the side surface, such as about 0 microns to about 100 microns past the side surface, such as about 0 microns to about 10 microns past the side surface, such as about 0 microns to about 5 microns past the side surface. In some examples, the laser ablation process may be performed in multiple passes of the laser over the same position of the workpiece at the fixed focal depth to achieve desired materials removal or thickness reduction in the exposed surface. For instance, multiple passes of the laser at a fixed focal depth at about 1 microns past the side surface may be performed to achieve a desired reduction in thickness of about 25 microns or more.

In some examples, the edge portion of the semiconductor wafer may be ablated at 204 by providing emission of the laser in a plurality of scans across the edge portion. For instance, each scan of the plurality of scans may have a scan dimension (e.g., spot size) representative of a dimension of the laser on the edge surface. The scan dimension (e.g., spot size) may be in a range of, for instance, 10 microns to about 25 millimeter, such as about 500 microns to about 25 millimeters, such as about 1 millimeter to about 25 millimeters, such as about 1 millimeter to about 10 millimeters. In some examples, there may be a distance between passes of each laser. The distance between each scan or pass may be, for instance, in a range of about 0 millimeters to about 1 millimeter, such as about 0 microns to about 500 microns. In some examples, there may be no distance between passes of each laser. In some examples, there may be overlap between scans or passes of the laser on the surface. In some examples, there may be about 0% to about 50% overlap of the scan dimension between passes of each laser. Additionally, or alternatively, each scan of the plurality of scans may remove material to a depth of about 1 micron to about 10 microns.

In some examples, the edge portion of the semiconductor wafer may be ablated at 204 to form a laser-defined surface. The laser-defined surface may include a plurality of laser-defined features (e.g., strips) arranged in a repeating pattern on the laser-defined surface. The plurality of laser-defined features may extend vertically, horizontally, or at an angle between first and second opposing major surfaces of the semiconductor wafer.

In some examples, the edge portion of the semiconductor wafer may be ablated at 204 to form a shaped workpiece edge around a perimeter of the wide bandgap semiconductor workpiece. For instance, the shaped workpiece edge may include a laser-defined surface, such as that depicted in FIG. 7A. Additionally, or alternatively, the shaped workpiece edge formed by ablation at 204 may include one or more strain relief features and/or one or more cooling features, such as depicted in FIG. 7B.

At 206, the method 200 includes controlling one or more mirrors of the laser source to direct the laser to the edge portion of the semiconductor wafer. At 208, the method 200 includes controlling position of a workpiece support to direct the laser to the edge portion of the semiconductor wafer. One or both of operations 206 and 208 can be utilized as part of the laser ablation process to impart relative motion between the semiconductor wafer and the laser ablating the edge portions thereof. Based on currently available technology, directing the laser by control of laser source mirrors at 206 can be done faster than directing the laser by controlling position of a workpiece support. As such, it may be desirable to at least incorporate the controlling operation at 206.

For instance, in one example laser-based edge shaping operation according to examples of the present disclosure, the laser may, for example, scan an azimuthal section (e.g., a section of about 20 degrees or less) by controlling mirrors in the laser source at 206. The position of a workpiece support or other fixture on which the semiconductor wafer is mounted may then be controlled at 208 to orient the laser towards another azimuthal section. In some examples, the edge portion of the semiconductor wafer may be ablated within each of a plurality of azimuthal sections of the semiconductor wafer in a predetermined (e.g., sequential) manner. For instance, each azimuthal section can be ablated in a plurality of vertical scans across the azimuthal section. In some embodiments, each azimuthal section may be about 20 degrees or less.

At 210, the method 200 may include obtaining sensor data from a sensor indicative of a current state of the edge portion. For example, sensor data may be obtained from a sensor positioned relative to the laser source and the semiconductor wafer. The sensor data may be indicative of a current state of the edge portion as observed in real-time or near real-time before, during, and/or after the laser ablation process. For instance, the sensor data obtained at 210 may include surface characterization data of the side surface. The sensor data obtained at 210 may include a surface topographical mapping or an image of the side surface obtained using an optical sensor. In some examples, the sensor data obtained at 210 may include a scan of the side surface obtained using one or more surface measurement lasers or other optical devices. In other examples, the sensor data obtained at 210 may include an image captured of the side surface and analyzed using computer image processing techniques to determine data indicative of a surface characterization of the side surface.

At 212, the method 200 may include adjusting one or more laser ablation parameters of the laser source based at least in part on the sensor data obtained at 210, thus providing active feedback monitoring and precision control for laser edge shaping operations. In some examples, the parameters adjusted at 212 may be defined as a function of position on the side surface of the semiconductor wafer (e.g., the parameters are modified and changed based on position of the one or more lasers on the side surface). The laser parameters may be adjusted and/or selected as a function of position on the side surface. For instance, the laser parameters at a first position requiring more edge shaping may be different from the laser parameters at a second position requiring less edge shaping. Additionally, or alternatively, the laser ablation parameters adjusted at 212 may include one or more parameters associated with the laser source, such as but not limited to a laser wavelength, laser power, laser pulse duration, pulse frequency, translation speed, focusing depth, or the like.

Figure 11:
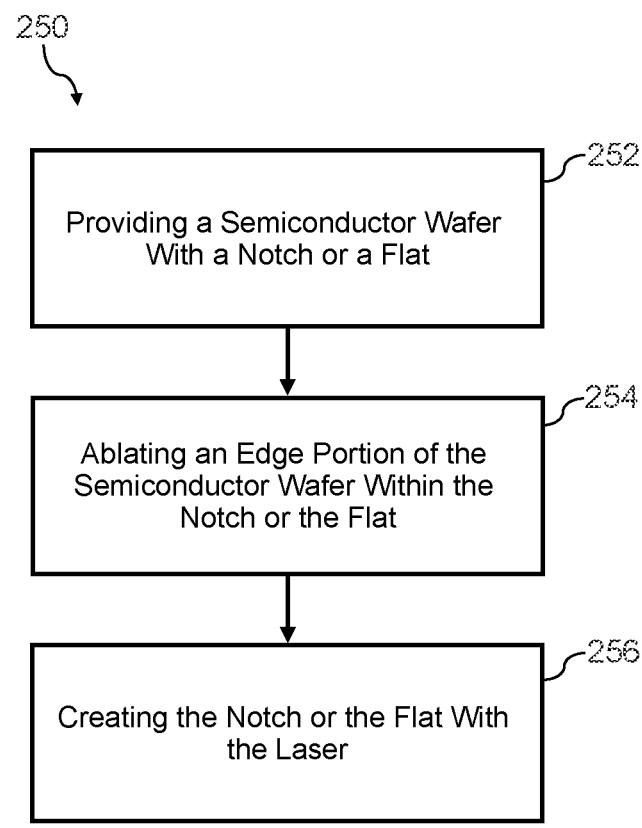
FIG. 11 depicts a flow chart diagram of an example method according to examples of the present disclosure.

FIG. 11 depicts a flow chart diagram of an example method 250 according to aspects of the present disclosure. The method 250 includes operations illustrated in a particular order for purposes of illustration and discussion. Those of ordinary skill in the art, using the disclosures provided herein, will understand that the various steps or operations of any of the methods provided in this disclosure may be adapted, rearranged, omitted, include steps not illustrated, and/or modified in various ways without deviating from the scope of the present disclosure.

At 252, the method 250 may include providing a semiconductor wafer with a notch or a flat. A notch provided at 252 may include a relatively small indentation along a peripheral edge of the semiconductor wafer. The notch may be formed in a particular shape (e.g., a V-shape or a C-shape as shown, for example, in FIGS. 4D-4E)). The notch may serve a functional purpose for orientation, alignment, and/or a grip location for safe handling of the semiconductor wafer. A flat provided at 252 may include a substantially straight edge cut into a peripheral edge of a round semiconductor wafer. The flat may serve a functional purpose for alignment, orientation, and/or a reference for the orientation of semiconductor crystalline material used to fabricate the wafer.

At 254, the method 250 may include ablating an edge portion of the semiconductor wafer within the notch and/or the flat provided at 252. In some examples, the entire periphery of a semiconductor side surface is shaped such that any notches or flats are automatically ablated as part of the peripheral edge shaping process.

At 256, the method 250 may include creating the notch or the flat with the laser. When creating the notch, the laser may be emitted in the same direction or in a different direction (e.g., rotated by about 90 degrees) relative to the laser direction used for edge shaping as set forth in FIG. 10.

Figure 12:
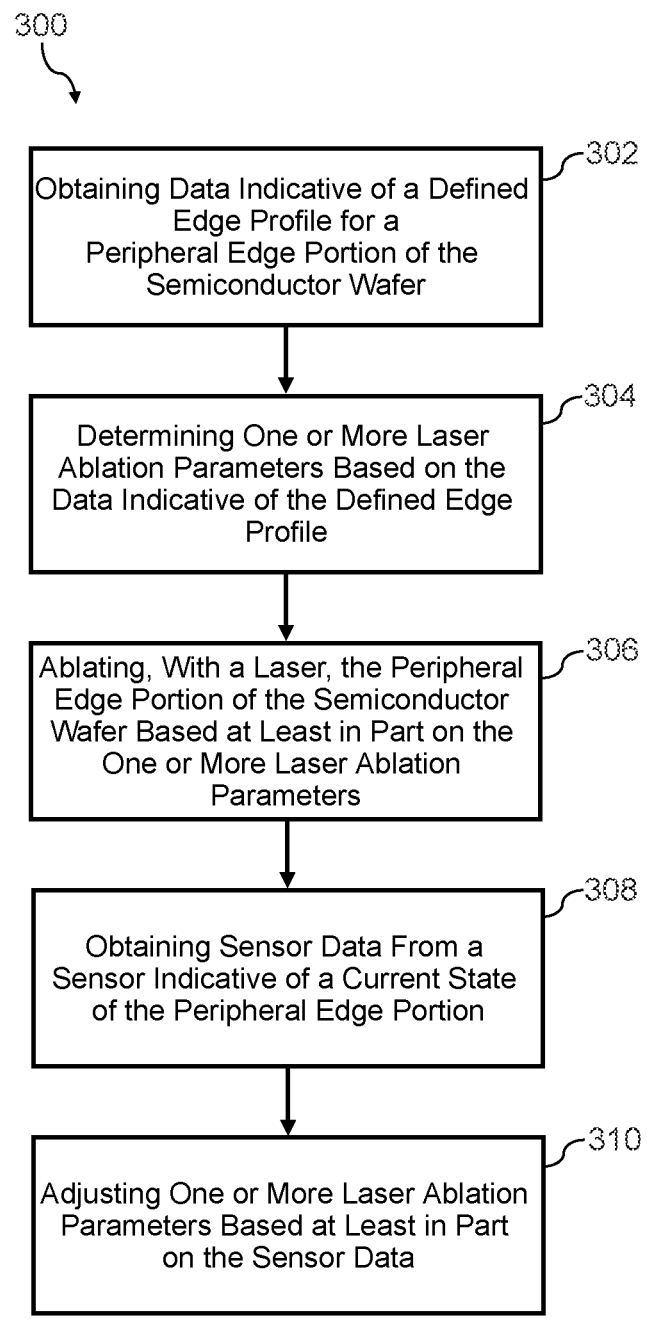
FIG. 12 depicts a flow chart diagram of an example method according to examples of the present disclosure.

FIG. 12 depicts a flow chart diagram of an example method 300 according to aspects of the present disclosure. The method 300 includes operations illustrated in a particular order for purposes of illustration and discussion. Those of ordinary skill in the art, using the disclosures provided herein, will understand that the various steps or operations of any of the methods provided in this disclosure may be adapted, rearranged, omitted, include steps not illustrated, and/or modified in various ways without deviating from the scope of the present disclosure.

At 302, the method 300 may include obtaining data indicative of a defined edge profile for a peripheral edge portion of a semiconductor wafer. For example, the defined edge profile may correspond to a beveled edge, a rounded edge, other non-perpendicular edge, any of the example edge profiles depicted in FIGS. 5A-5D, or other particular profiles.

At 304, the method 300 may include determining one or more laser ablation parameters based on the data indicative of the defined edge profile. For example, the one or more laser ablation parameters determined at 304 may be defined as a function of position on the side surface of the semiconductor wafer (e.g., the parameters are modified and changed based on position of the one or more lasers on the side surface). Additionally, or alternatively, the laser ablation parameters determined at 304 may include one or more parameters associated with the laser source, such as but not limited to a laser wavelength, laser power, laser pulse duration, pulse frequency, translation speed, focusing depth, or the like.

At 306, the method 300 may include ablating, with a laser, the peripheral edge portion of the semiconductor wafer based at least in part on the one or more laser ablation parameters. In some examples, ablating, with the laser, at 306 includes positioning a laser source to output the laser in a first plane that is generally parallel to a plane defined by a major surface of the semiconductor wafer. Emission of the laser may then be provided from the laser source towards the peripheral edge portion of the semiconductor wafer. Additional aspects of the laser ablation implemented at 306 may be similar to those already described at 204 in method 200 of FIG. 10.

At 308, the method 300 may include obtaining sensor data from a sensor indicative of a current state of the peripheral edge portion. For example, sensor data may be obtained from a sensor positioned relative to the laser source and the semiconductor wafer. The sensor data may be indicative of a current state of the edge portion as observed in real-time or near real-time before, during, and/or after the laser ablation process. For instance, the sensor data obtained at 308 may include surface characterization data of the side surface. The sensor data obtained at 308 may include a surface topographical mapping or an image of the side surface obtained using an optical sensor. In some examples, the sensor data obtained at 308 may include a scan of the side surface obtained using one or more surface measurement lasers or other optical devices. In other examples, the sensor data obtained at 308 may include an image captured of the side surface and analyzed using computer image processing techniques to determine data indicative of a surface characterization of the side surface.

At 310, the method 300 may include adjusting the one or more laser ablation parameters determined at 304 based at least in part on the sensor data. For example, adjustments or tuning of the previously determined laser ablation parameters may be specified as a function of position on the side surface of a wafer and/or as a function of one or more parameters associated with the laser source, such as, but not limited to, a laser wavelength, laser power, laser pulse duration, pulse frequency, translation speed, focusing depth, or the like.

Example aspects of the present disclosure are set forth below. Any of the below features or examples may be used in combination with any of the embodiments or features provided in the present disclosure.

One example aspect of the present disclosure is directed to a method. The method includes providing emission of a laser from a laser source towards an edge portion of a wide bandgap semiconductor workpiece from a direction facing a side surface of the wide bandgap semiconductor workpiece, the side surface extending between a first major surface of the wide bandgap semiconductor workpiece and an opposing second major surface of the wide bandgap semiconductor workpiece. The method includes ablating the edge portion of the wide bandgap semiconductor workpiece with the laser to remove material from the edge portion of the wide bandgap semiconductor workpiece.

In some examples, providing emission of the laser from the laser source towards the edge portion of the wide bandgap semiconductor workpiece includes positioning the laser source to output the laser in a first plane that is generally parallel to respective planes defined by the first major surface and the opposing second major surface of the wide bandgap semiconductor workpiece.

In some examples, ablating the edge portion of the wide bandgap semiconductor workpiece includes ablating the edge portion to have a defined edge profile.

In some examples, the defined edge profile is a beveled edge or a rounded edge.

In some examples, ablating the edge portion of the wide bandgap semiconductor workpiece with the laser includes obtaining data indicative of the defined edge profile. In some examples, ablating the edge portion of the wide bandgap semiconductor workpiece with the laser includes determining one or more laser ablation parameters based on the data indicative of the defined edge profile. In some examples, ablating the edge portion of the wide bandgap semiconductor workpiece with the laser includes ablating, with the laser, the edge portion of the wide bandgap semiconductor workpiece based at least in part on the one or more laser ablation parameters.

In some examples, the method includes obtaining sensor data from a sensor indicative of a current state of the edge portion. In some examples, the method includes adjusting one or more laser ablation parameters based at least in part on the sensor data.

In some examples, the one or more laser ablation parameters comprise one or more of focusing depth, laser power, laser wavelength, laser pulse duration, laser pulse frequency, or translation speed.

In some examples, the one or more laser ablation parameters are defined as a function of position about the edge portion of the wide bandgap semiconductor workpiece.

In some examples, ablating the edge portion of the wide bandgap semiconductor workpiece includes reducing a surface roughness of the edge portion of the wide bandgap semiconductor workpiece.

In some examples, the edge portion of the wide bandgap semiconductor workpiece includes a peripheral edge that defines a perimeter of the wide bandgap semiconductor workpiece.

In some examples, the wide bandgap semiconductor workpiece has a notch or a flat.

In some examples, ablating the edge portion of the wide bandgap semiconductor workpiece includes ablating within the notch or the flat.

In some examples, the method includes creating the notch or the flat with the laser.

In some examples, ablating the edge portion of the wide bandgap semiconductor workpiece includes ablating a peripheral edge portion of the wide bandgap semiconductor workpiece such that the wide bandgap semiconductor workpiece has a defined diameter around the peripheral edge portion.

In some examples, ablating the edge portion of the wide bandgap semiconductor workpiece includes ablating the edge portion within each of a plurality of azimuthal sections of the wide bandgap semiconductor workpiece.

In some examples, ablating the edge portion within each azimuthal section comprising ablating the azimuthal section in a plurality of vertical scans across the azimuthal section.

In some examples, each azimuthal section is about 20 degrees or less.

In some examples, ablating the edge portion of the wide bandgap semiconductor workpiece includes providing emission of the laser in a plurality of scans across the edge portion, wherein each scan of the plurality of scans has a scan dimension of about 10 microns to about 25 millimeters.

In some examples, each scan of the plurality of scans removes material to a depth of about 1 micron to about 10 microns.

In some examples, ablating the edge portion of the wide bandgap semiconductor workpiece with the laser provided from the laser source includes forming a shaped workpiece edge around a perimeter of the wide bandgap semiconductor workpiece.

In some examples, the shaped workpiece edge has one or more strain relief features or one or more cooling features.

In some examples, the shaped workpiece edge includes a laser-defined surface.

In some examples, the laser-defined surface includes a plurality of laser-defined strips arranged in a repeating pattern on the laser-defined surface.

In some examples, ablating the edge portion of the wide bandgap semiconductor workpiece forms a shaped edge portion having a surface with a surface roughness in a range of less about 0.1 micron to about 1 micron.

In some examples, the wide bandgap semiconductor workpiece includes silicon carbide.

In some examples, the wide bandgap semiconductor workpiece includes a Group III-nitride.

In some examples, the method includes controlling one or more mirrors of the laser source to direct the laser to the edge portion of the wide bandgap semiconductor workpiece.

One example aspect of the present disclosure is directed to a system. The system includes a workpiece support configured to support a semiconductor workpiece, the semiconductor workpiece having a side surface extending between a first major surface and an opposing second major surface. The system includes a laser source configured to: emit a laser towards an edge portion of the semiconductor workpiece from a direction facing the side surface of the semiconductor workpiece, and ablate the edge portion of the semiconductor workpiece with the laser.

In some examples, the laser source is configured to ablate the edge portion of the semiconductor workpiece with the laser to have a defined edge profile.

In some examples, the defined edge profile is a beveled edge or a rounded edge.

In some examples, the system includes a controller configured to perform operations. In some examples, the operations include obtaining data indicative of the defined edge profile. In some examples, the operations include determining one or more laser ablation parameters based on the data indicative of the defined edge profile In some examples, the system includes a sensor operable to obtain sensor data indicative of a current state of the edge portion. In some implementations, the operations include adjusting the one or more laser ablation parameters based at least in part on the sensor data.

In some examples, the one or more laser ablation parameters comprise one or more of focusing depth, laser power, laser wavelength, laser pulse duration, laser pulse frequency, or translation speed.

In some examples, the one or more laser ablation parameters are defined as a function of position about the edge portion of the semiconductor workpiece.

In some examples, the laser source is configured to ablate the edge portion of the semiconductor workpiece with the laser to reduce a surface roughness of the edge portion of the semiconductor workpiece.

In some examples, the edge portion of the semiconductor workpiece includes a peripheral edge that defines a perimeter of the semiconductor workpiece.

In some examples, the semiconductor workpiece has a notch or a flat.

In some examples, the laser source is configured to ablate the edge portion of the semiconductor workpiece with the laser within the notch or the flat.

In some examples, the laser source is configured to create the notch or the flat with the laser.

In some examples, the laser source is configured to ablate the edge portion of the semiconductor workpiece with the laser such that the semiconductor workpiece has a defined diameter around the edge portion.

In some examples, the laser source is configured to ablate the edge portion within each of a plurality of azimuthal sections of the semiconductor workpiece.

In some examples, the laser source is configured to ablate the edge portion within each azimuthal section in a plurality of vertical scans across the azimuthal section.

In some examples, each azimuthal section is about 20 degrees or less.

In some examples, the laser source is configured to emit the laser in a plurality of scans across the edge portion, wherein each scan of the plurality of scans has a scan dimension of about 10 microns to about 25 millimeters.

In some examples, each scan of the plurality of scans removes material to a depth of about 1 micron to about 10 microns.

In some examples, the laser source is configured to ablate the edge portion of the semiconductor workpiece with the laser to form a shaped workpiece edge around a perimeter of the semiconductor workpiece.

In some examples, the shaped workpiece edge has strain relief features or cooling features.

In some examples, the shaped workpiece edge includes a laser-defined surface.

In some examples, the laser-defined surface includes a plurality of laser-defined features arranged in a repeating pattern on the laser-defined surface.

In some examples, the laser source is configured to ablate the edge portion of the semiconductor workpiece with the laser to form a shaped edge portion having a surface with a surface roughness in a range of about 0.1 microns to about 1 micron.

In some examples, the semiconductor workpiece includes silicon carbide.

In some examples, the semiconductor workpiece includes a Group III-nitride.

In some examples, the system includes one or more mirrors coupled to the laser source, the one or more mirrors operable to direct the laser to the edge portion of the semiconductor workpiece.

One example aspect of the present disclosure is directed to a method. The method includes obtaining data indicative of a defined edge profile for a peripheral edge portion of the semiconductor workpiece. The method includes determining one or more laser ablation parameters based on the data indicative of the defined edge profile. The method includes ablating, with a laser, the peripheral edge portion of the semiconductor workpiece based at least in part on the one or more laser ablation parameters.

In some examples, the method includes obtaining sensor data from a sensor indicative of a current state of the peripheral edge portion. In some examples, the method includes adjusting one or more laser ablation parameters based at least in part on the sensor data.

In some examples, the one or more laser ablation parameters comprise one or more of focusing depth, laser power, laser wavelength, laser pulse duration, laser pulse frequency, or translation speed.

In some examples, the one or more laser ablation parameters are defined as a function of position about the peripheral edge portion of the semiconductor workpiece.

In some examples, ablating, with the laser, the peripheral edge portion of the semiconductor workpiece includes reducing a surface roughness of the peripheral edge portion of the semiconductor workpiece.

In some examples, the semiconductor workpiece has a notch or a flat.

In some examples, ablating, with the laser, the peripheral edge portion of the semiconductor workpiece includes ablating within the notch or the flat.

In some examples, the method includes creating the notch or the flat with the laser.

In some examples, ablating, with the laser, the peripheral edge portion of the semiconductor workpiece includes ablating the peripheral edge portion within each of a plurality of azimuthal sections of the semiconductor workpiece.

In some examples, the method includes ablating the peripheral edge portion within each azimuthal section comprising ablating the azimuthal section in a plurality of vertical scans across the azimuthal section.

In some examples, each azimuthal section is about 20 degrees or less.

In some examples, ablating, with the laser, the peripheral edge portion of the semiconductor workpiece includes providing emission of the laser in a plurality of scans across the peripheral edge portion, wherein each scan of the plurality of scans has a scan dimension of about 10 microns to about 25 millimeters.

In some examples, each scan of the plurality of scans removes material to a depth of about 1 micron to about 10 microns.

One aspect of the present disclosure is directed to a semiconductor wafer. The semiconductor wafer includes a silicon carbide structure defined by first and second opposing major surfaces and a peripheral edge. In some examples, the semiconductor wafer includes a laser-defined surface formed along at least a portion of the peripheral edge of the silicon carbide structure.

In some examples, the laser-defined surface includes a plurality of laser-defined features arranged in a repeating pattern on the laser-defined surface.

In some examples, the plurality of laser-features arranged in the repeating pattern on the laser-defined surface extend vertically between first and second opposing major surfaces of the silicon carbide structure.

In some examples, a diameter of the semiconductor wafer is between about 150 millimeters and 200 millimeters.

In some examples, the semiconductor wafer has a thickness between the first and second opposing major surfaces of between about 100 microns and 200 microns.

In some examples, the laser-defined surface spans the thickness between the first and second opposing major surfaces at the portion of the peripheral edge of the silicon carbide structure.

In some examples, the portion of the peripheral edge of the silicon carbide structure has one or more strain relief features or one or more cooling features.

In some examples, the laser-defined surface has a surface roughness in a range of about 0.1 microns to about 1 micron.

In some examples, the laser-defined surface is formed along at least a portion of the peripheral edge of the silicon carbide structure.

In some examples, the portion of the peripheral edge of the silicon carbide structure has a defined diameter around the portion of the peripheral edge.

In some examples, the laser-defined surface formed along at least the portion of the peripheral edge of the silicon carbide structure has a defined edge profile.

In some examples, the defined edge profile is a beveled edge or a rounded edge.

In some examples, the silicon carbide structure has a notch or a flat.

In some examples, the portion of the peripheral edge along which the laser-defined surface is formed includes the notch or the flat.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method, comprising:
   providing emission of a laser from a laser source towards an edge portion of a semiconductor workpiece from a direction facing a side surface of the semiconductor workpiece, the side surface extending between a first major surface of the semiconductor workpiece and an opposing second major surface of the semiconductor workpiece; and
   ablating the edge portion of the semiconductor workpiece with the laser to remove material from the edge portion of the semiconductor workpiece,
   wherein the semiconductor workpiece comprises silicon carbide or a Group III-nitride.

2. The method of claim 1, wherein providing emission of the laser from the laser source towards the edge portion of the semiconductor workpiece comprises:
   positioning the laser source to output the laser in a first plane that is generally parallel to respective planes defined by the first major surface and the opposing second major surface of the semiconductor workpiece.

3. The method of claim 1, wherein ablating the edge portion of the semiconductor workpiece comprises ablating the edge portion to have a defined edge profile, wherein the defined edge profile is a beveled edge or a rounded edge.

4. The method of claim 1, wherein ablating the edge portion of the semiconductor workpiece with the laser comprises:
   obtaining data indicative of a defined edge profile;
   determining one or more laser ablation parameters based on the data indicative of the defined edge profile; and
   ablating, with the laser, the edge portion of the semiconductor workpiece based at least in part on the one or more laser ablation parameters.

5. The method of claim 4, further comprising:
   obtaining sensor data from a sensor indicative of a current state of the edge portion; and
   adjusting one or more laser ablation parameters based at least in part on the sensor data.

6. The method of claim 1, wherein ablating the edge portion of the semiconductor workpiece comprises reducing a surface roughness of the edge portion of the semiconductor workpiece.

7. The method of claim 1, wherein the semiconductor workpiece has a notch or a flat, ablating the edge portion of the semiconductor workpiece comprises ablating within the notch or the flat.

8. The method of claim 7, further comprising creating the notch or the flat with the laser.

9. The method of claim 1, wherein ablating the edge portion of the semiconductor workpiece comprises:
   ablating the edge portion within each of a plurality of azimuthal sections of the semiconductor workpiece.

10. The method of claim 9, wherein ablating the edge portion within each azimuthal section comprises ablating the azimuthal section in a plurality of vertical, horizontal, or angled scans across the azimuthal section.

11. The method of claim 1, wherein the method further comprises: ablating one or more strain relief features or one or more cooling features in the side surface.

12. The method of claim 1, wherein ablating the edge portion of the semiconductor workpiece forms a shaped edge portion having a surface with a surface roughness in a range of less about 0.1 micron to about 1 micron.

13. A system for forming a semiconductor workpiece, the system comprising:
    a workpiece support configured to support a semiconductor workpiece, the semiconductor workpiece having a side surface extending between a first major surface and an opposing second major surface;
    a laser source configured to: emit a laser towards an edge portion of the semiconductor workpiece from a direction facing the side surface of the semiconductor workpiece, and ablate the edge portion of the semiconductor workpiece with the laser; and
    a controller configured to perform operations, the operations comprising:
      obtaining data indicative of a defined edge profile;
      determining one or more laser ablation parameters based on the data indicative of the defined edge profile; and
      controlling the laser to ablate the edge portion of the semiconductor workpiece based at least in part on the one or more laser ablation parameters.

14. The system of claim 13, further comprising:
    a sensor operable to obtain sensor data indicative of a current state of the edge portion; and
    wherein the operations further comprise adjusting the one or more laser ablation parameters based at least in part on the sensor data.

15. The system of claim 13, wherein the laser source is configured to ablate the edge portion within each of a plurality of azimuthal sections of the semiconductor workpiece.

16. The system of claim 13, wherein the laser source is configured to emit the laser in a plurality of scans across the edge portion, wherein each scan of the plurality of scans has a scan dimension of about 10 microns to about 25 millimeters.

17. The system of claim 16, wherein each scan of the plurality of scans removes material to a depth of about 1 micron to about 10 microns.

18. The system of claim 13, wherein the semiconductor workpiece comprises silicon carbide or a Group III-nitride.

19. A method, comprising:

providing emission of a laser from a laser source towards an edge portion of a semiconductor workpiece from a direction facing a side surface of the semiconductor workpiece, the side surface extending between a first major surface of the semiconductor workpiece and an opposing second major surface of the semiconductor workpiece; and ablating the edge portion of the semiconductor workpiece with the laser to remove material from the edge portion of the semiconductor workpiece, wherein ablating the edge portion of the semiconductor workpiece comprises reducing a surface roughness of the edge portion of the semiconductor workpiece.

20. The method of claim 19, wherein the method further comprises ablating one or more strain relief features or one or more cooling features in the side surface.

21. A method, comprising:

providing emission of a laser from a laser source towards an edge portion of a semiconductor workpiece from a direction facing a side surface of the semiconductor workpiece, the side surface extending between a first major surface of the semiconductor workpiece and an opposing second major surface of the semiconductor workpiece; and ablating the edge portion of the semiconductor workpiece with the laser to remove material from the edge portion of the semiconductor workpiece, wherein providing emission of the laser from the laser source towards the edge portion of the semiconductor workpiece comprises:

positioning the laser source to output the laser in a first plane that is generally parallel to respective planes defined by the first major surface and the opposing second major surface of the semiconductor workpiece.

\* \* \* \* \*